United States Patent
Li et al.

(10) Patent No.: US 9,832,533 B2
(45) Date of Patent: Nov. 28, 2017

(54) NETWORK INTERFACE DEVICE HAVING A SOLID-STATE SAFEGUARD APPARATUS FOR PRESERVING THE QUALITY OF PASSIVE OPERATION IN THE EVENT OF DISRUPTIVE OPERATIONAL CONDITIONS

(71) Applicant: PPC Broadband, Inc., East Syracuse, NY (US)

(72) Inventors: Yan Li, Syracuse, NY (US); Paul F. Bailey, Camillus, NY (US); Erdogan Alkan, Fayetteville, NY (US)

(73) Assignee: PPC BROADBAND, INC., East Syracuse, NY (US)

( * ) Notice: Subject to any disclaimer, the term of this patent is extended or adjusted under 35 U.S.C. 154(b) by 94 days.

(21) Appl. No.: 13/969,064

(22) Filed: Aug. 16, 2013

(65) Prior Publication Data

US 2014/0033264 A1    Jan. 30, 2014

Related U.S. Application Data

(63) Continuation-in-part of application No. 13/669,805, filed on Nov. 6, 2012, now Pat. No. 8,793,755.

(60) Provisional application No. 61/559,508, filed on Nov. 14, 2011.

(51) Int. Cl.
| | |
|---|---|
| *H04N 7/173* | (2011.01) |
| *H04N 21/61* | (2011.01) |
| *H04L 12/28* | (2006.01) |
| *H04N 7/10* | (2006.01) |
| *H04N 21/436* | (2011.01) |
| *H03H 7/18* | (2006.01) |
| *H03H 7/48* | (2006.01) |

(52) U.S. Cl.
CPC .......... *H04N 21/61* (2013.01); *H04L 12/2801* (2013.01); *H04L 12/2892* (2013.01); *H04N 7/104* (2013.01); *H04N 7/17309* (2013.01); *H03H 7/185* (2013.01); *H03H 7/48* (2013.01); *H04N 21/436* (2013.01); *H04N 21/6118* (2013.01)

(58) Field of Classification Search
CPC ... H04N 21/61; H04N 21/436; H04N 21/6118
USPC ......................................................... 725/127
See application file for complete search history.

(56) References Cited

U.S. PATENT DOCUMENTS

| | | | |
|---|---|---|---|
| 4,430,731 A   | 2/1984 | Gimple et al. | |
| 4,920,233 A * | 4/1990 | Kincaid | ........................... 174/36 |
| 5,125,100 A * | 6/1992 | Katznelson | .................... 725/143 |
| 5,399,927 A * | 3/1995 | Gruber | ............... H03K 17/6874 |
| | | | 327/379 |
| 5,481,389 A * | 1/1996 | Pidgeon et al. | .............. 398/208 |
| 5,594,394 A * | 1/1997 | Sasaki et al. | ................. 333/103 |
| 5,604,528 A * | 2/1997 | Edwards et al. | ................. 725/25 |

(Continued)

FOREIGN PATENT DOCUMENTS

WO          0111767 A1    2/2001

*Primary Examiner* — Michael B Pierorazio
(74) *Attorney, Agent, or Firm* — MH2 Technology Law Group, LLP

(57) ABSTRACT

A network interface device has a safeguard apparatus. The safeguard apparatus is operable in power on, power off, and degraded power conditions. In power on operation, the safeguard apparatus maintains the quality of active and passive branch communications. During power off and degraded power operation, the safeguard apparatus safeguards the quality of the passive communication path.

60 Claims, 19 Drawing Sheets

(56) References Cited

U.S. PATENT DOCUMENTS

| | | | |
|---|---|---|---|
| 5,793,606 A * | 8/1998 | Cubbage et al. | 361/679.29 |
| 5,834,697 A * | 11/1998 | Baker et al. | 174/113 R |
| 5,854,736 A * | 12/1998 | Fuhs et al. | 361/679.57 |
| 5,930,678 A * | 7/1999 | Alley et al. | 725/146 |
| 6,091,932 A | 7/2000 | Langlais | |
| 6,466,913 B1 * | 10/2002 | Yasuda et al. | 704/500 |
| 6,542,540 B1 | 4/2003 | Leung et al. | |
| 6,721,371 B1 * | 4/2004 | Barham et al. | 375/316 |
| 7,133,652 B2 | 11/2006 | Nast et al. | |
| 7,530,091 B2 * | 5/2009 | Vaughan | 725/106 |
| 7,580,693 B2 | 8/2009 | Rohde et al. | |
| 7,679,471 B2 | 3/2010 | Rijssemus et al. | |
| 7,883,363 B2 * | 2/2011 | Montena | 439/578 |
| 8,045,066 B2 * | 10/2011 | Vorenkamp et al. | 348/726 |
| 8,429,695 B2 * | 4/2013 | Halik et al. | 725/78 |
| 8,589,997 B2 * | 11/2013 | Wells | 725/127 |
| 8,611,528 B2 * | 12/2013 | Hazani et al. | 379/413.02 |
| 2001/0046268 A1 * | 11/2001 | Sharma | 375/324 |
| 2002/0056135 A1 | 5/2002 | Sharma | 725/126 |
| 2004/0244053 A1 * | 12/2004 | Golombek | 725/127 |
| 2005/0056454 A1 * | 3/2005 | Clark | 174/113 R |
| 2006/0094394 A1 * | 5/2006 | Yamamoto | H04B 1/006 455/333 |
| 2006/0124342 A1 * | 6/2006 | Clark | 174/113 R |
| 2006/0141976 A1 * | 6/2006 | Rohde et al. | 455/326 |
| 2008/0227333 A1 * | 9/2008 | Hazani et al. | 439/578 |
| 2008/0231111 A1 * | 9/2008 | Hazani et al. | 307/3 |
| 2010/0017842 A1 * | 1/2010 | Wells | H04M 11/066 725/149 |
| 2010/0100918 A1 * | 4/2010 | Egan et al. | 725/111 |
| 2010/0125877 A1 * | 5/2010 | Wells et al. | 725/78 |
| 2010/0146564 A1 * | 6/2010 | Halik et al. | 725/78 |
| 2010/0211811 A1 * | 8/2010 | Zhou et al. | 713/330 |
| 2010/0266000 A1 * | 10/2010 | Froimovich et al. | 375/222 |
| 2010/0311277 A1 * | 12/2010 | Montena | 439/638 |
| 2011/0140761 A1 | 6/2011 | Nagayama et al. | |
| 2011/0154429 A1 * | 6/2011 | Stantchev | 725/149 |
| 2011/0199012 A1 * | 8/2011 | Lai | 315/219 |
| 2011/0304201 A1 * | 12/2011 | Sun | 307/10.1 |
| 2012/0151548 A1 * | 6/2012 | Rakib | 725/126 |
| 2013/0125193 A1 * | 5/2013 | Wells | 725/127 |
| 2013/0227632 A1 * | 8/2013 | Wells et al. | 725/127 |
| 2014/0033264 A1 * | 1/2014 | Li et al. | 725/127 |

* cited by examiner

NETWORK INTERFACE DEVICE HAVING A SOLID-STATE SAFEGUARD APPARATUS FOR PRESERVING THE QUALITY OF PASSIVE OPERATION IN THE EVENT OF DISRUPTIVE OPERATIONAL CONDITIONS

PRIORITY CLAIM

This application is a continuation-in-part of, and claims the benefit and priority of, U.S. patent application Ser. No. 13/669,805, filed on Nov. 6, 2012, which claims the benefit and priority of U.S. Provisional Patent Application Ser. No. 61/559,508, filed on Nov. 14, 2011. The entire contents of such applications are hereby incorporated by reference.

CROSS REFERENCE TO RELATED APPLICATION

This application is related to the following commonly-owned, co-pending patent application: U.S. patent application Ser. No. 12/250,229, filed on Oct. 13, 2008.

COPYRIGHT NOTICE

A portion of the disclosure of this patent document contains or may contain material which is subject to copyright protection. The copyright owner has no objection to the photocopy reproduction by anyone of the patent document or the patent disclosure in exactly the form it appears in the Patent and Trademark Office patent file or records, but otherwise reserves all copyrights whatsoever.

FIELD OF THE ART

This disclosure relates generally to the transmission and reception of radio or high-frequency signals over cable networks, such as cable television (CATV) networks. More particularly, the disclosure relates to an improved network interface device.

BACKGROUND

CATV service providers offer television, data, telephone and other entertainment and useful services to subscribers at the subscriber's premises.

The typical medium for delivering these services is a cable network which is formed by a relatively large number of high-frequency, electrical signal-conducting coaxial conductors or cables, all of which are linked together to distribute the high-frequency signals over a wide geographic area to substantial numbers of geographically-separated subscribers. The high-frequency signals are delivered to television sets, computers, telephones and other subscriber devices, and those subscriber devices convert the information carried by the high-frequency signals into the services that the subscriber desires.

Because of the extensive nature of the cable network, the signals received at the subscriber premises are reduced in strength compared to the strength of the transmitted signals. The amount of signal strength reduction depends on the length of the pathway through the cable network which the signals pass before arriving at the subscriber premises. For this reason, it is typical to provide an amplifier at the subscriber premises to increase or amplify the strength of the signals received from the cable network before delivering the signals to the subscriber devices.

Some types of subscriber devices, such as television sets, deliver better performance in response to receiving amplified signals. Other types of subscriber devices may require non-amplified or passive signals for proper functionality. For example, lifeline telephone service operates on the basis of passive signals received at the subscriber premises, because the functionality of such telephone service cannot depend on the proper functionality of an amplifier or other active signal conditioner in the signal path. A failed or inoperative amplifier or other active device in the signal path could completely terminate telephone communications, which could be dangerous in emergency situations.

Passive-active network interface devices have been developed to provide both passive and active, i.e. amplified, signals at the subscriber premises for the two different types of subscriber devices which operate from passive and active signals. Such passive-active network interface devices include a signal splitter which essentially divides or branches the incoming, or "downstream," signals from the cable network into passive and active branches. The passive branch downstream signals are conducted through a passive branch of the network interface device without amplification or modification and applied to those subscriber devices which require passive signals for operation, such as, for example, a voice modem for a telephone set. The active branch downstream signals are conducted to an active signal conditioner, such as an amplifier, of an active branch of the network interface device. The active signal conditioner amplifies the strength of the signals or modifies some characteristic of the signals before the amplified, or conditioned, signals are delivered to one or more subscriber devices. The amplified signals are applied to those subscriber devices that benefit from the amplified signals, such as a television sets and computers.

The known passive-active interface devices have several disadvantages. They include electromechanical, moving parts. The moving parts can cause higher instances of failure or require undesirable levels of repair and maintenance. Also, the complexity of the known passive-active interface devices is associated with a relatively high manufacturing cost which, in turn, leads to a higher price passed along to the users of cable network services.

The high-frequency signals conducted through the cable network are susceptible to distortion from a number of sources. It is for this reason that coaxial cables are widely used to shield the high-frequency signals from degrading influences of the ambient environment. One requirement for maintaining high-quality signal conduction in a coaxial cable is properly terminating the coaxial cable. An improper termination causes reflections of the incident signals back into the transmission path. The reflections cause degradation of the desired incident signals received by the subscriber. The degradations are exemplified by amplitude ripple, group delay ripple, latency, and other similar effects which distort or reduce the incident signals. The signal reflections cause the subscriber to experience a degraded quality of service, or in some cases the level of degradation may prevent the subscriber from receiving meaningful service.

Therefore, there is a need to overcome, or otherwise lessen the effects of, the disadvantages and shortcomings described above.

SUMMARY

1. Network Interface Device—Switch-Based Phase Cancellation

A network interface device connecting subscriber devices to a CATV network over which downstream signals are transmitted to the subscriber devices and upstream signals are transmitted from the subscriber devices to a headend, the subscriber devices including a passive subscriber device and an active subscriber device, the network interface device including a first signal splitter which conducts CATV signals through a passive branch circuit and an active branch circuit, the active branch circuit including an active signal conditioner which modifies characteristics of active branch signals conducted through the active branch circuit, a sensor connected to the active branch circuit, the sensor sensing power consumption of the active branch circuit indicative of normal, inoperative and abnormally operative conditions of the network interface device, the sensor supplying a first control signal indicative of normal operating conditions and removing a second control signal indicative of inoperative and abnormal operating conditions, a selectable switch connected to the active branch circuit, the selectable switch having an activated position and a deactivated position, the selectable switch communicating the CATV signals between the CATV network and the subscriber devices when in the activated position, and the selectable switch communicating the CATV signals to a signal reduction path when in the deactivated position, the selectable switch assuming the activated position in response to the assertion of the first control signal and assuming the deactivated position in response to the de-assertion of the second control signal, and a phase cancellation circuit connected to the signal reduction path, the phase cancellation circuit adapted to convert the CATV signals into a reference signal and a phase-delayed signal, the phase-delayed signal being out of phase with respect to the reference signal, the phase cancellation circuit further adapted to recombine the reference signal and the phase-delayed signal to a single, reduced CATV signal.

A network interface device connecting subscriber devices to a CATV network over which downstream signals are transmitted to the subscriber devices and upstream signals are transmitted from the subscriber devices to a headend, the subscriber devices including a passive subscriber device and an active subscriber device, the network interface device including a first signal splitter which conducts CATV signals through a passive branch circuit and an active branch circuit, the active branch circuit including an active signal conditioner which modifies characteristics of active branch signals conducted through the active branch circuit, a sensor connected to the active branch circuit, the sensor sensing power consumption of the active branch circuit indicative of normal, inoperative and abnormally operative conditions of the network interface device, the sensor supplying a first control signal indicative of normal operating conditions and removing the second control signal indicative of inoperative and abnormal operating conditions, a selectable switch connected to the active branch circuit, the selectable switch having an activated position and a deactivated position, the selectable switch communicating the CATV signals between the CATV network and the subscriber devices when in the activated position, and the selectable switch communicating the CATV signals to a signal reduction path when in the deactivated position, the selectable switch assuming the activated position in response to the assertion of the first control signal and assuming the deactivated position in response to the de-assertion of the second control signal, and a phase cancellation circuit connected to the signal reduction path, the phase cancellation circuit adapted to convert the CATV signals into a plurality of signal components and communicate the plurality of signal components to a corresponding plurality of electrical paths, each of the corresponding plurality of electrical paths having different electrical lengths.

A network interface device connecting subscriber devices to a CATV network over which downstream signals are transmitted to the subscriber devices and valid upstream signals are transmitted from the subscriber devices to a headend, the subscriber devices including a passive subscriber device and an active subscriber device, the network interface device including a first signal splitter which conducts upstream and downstream signals through a passive branch circuit and an active branch circuit, the active branch circuit including an active signal conditioner which modifies characteristics of active branch upstream and downstream signals conducted through the active branch circuit, a sensor connected to sense power consumption of the active branch circuit indicative of normal, inoperative and abnormally operative conditions of the network interface device, the sensor supplying a first control signal indicative of normal operating conditions and supplying a second control signal indicative of inoperative and abnormal operating conditions, a first switch connected to the active branch circuit of the first signal splitter, the selectable switch having an activated position and a deactivated position, the selectable switch communicating the upstream and downstream CATV signals between the CATV network and the subscriber devices when in the activated position, and the selectable switch passing the upstream and downstream signals to a signal reduction path when in the deactivated position, the selectable switch assuming the activated position in response to the assertion of the first control signal and assuming the deactivated position in response to the de-assertion of the second control signal, a phase cancellation circuit connected to the signal reduction path, and a second switch connected to the active branch circuit and the control circuit, the second switch having an activated position and a deactivated position, the second switch communicating the upstream and downstream CATV signals between the CATV network and the active subscriber device when in the activated position, and the second switch receiving the reduced CATV upstream and downstream signal from the phase cancellation circuit when in the deactivated position, the second switch assuming the activated position in response to the assertion of the control signal and assuming the deactivated position in response to the de-assertion of the control signal.

2. Network Interface Device—Solid-State Safeguard Apparatus

An aspect of an embodiment is a network interface device (NID) operable to couple two or more subscriber devices to a CATV network. Downstream signals are transmittable to the two or more subscriber devices and upstream signals are transmittable from the two or more subscriber devices. The two or more subscriber devices include one or more passive subscriber devices and one or more active subscriber devices. The NID includes a signal splitter configured to separate CATV signals into passive branch signals and into active branch signals. The NID also includes an active branch circuit and a passive branch circuit. The active branch circuit includes an active signal conditioner operable to modify the active branch signals sent through the active branch circuit to the one or more active subscriber devices. The passive branch signals are sendable through the passive branch circuit to the one or more passive subscriber devices.

The NID includes a safeguard circuit operably coupled to the active branch circuit and the signal splitter (either directly connected or via intervening elements). The safeguard circuit has a first mode and a second mode. The safeguard circuit is configured to exchange the CATV signals between the CATV network and the one or more active subscriber devices when in the first mode and the safeguard circuit is configured to perform signal reduction when in the second mode. The safeguard circuit is configured to assume the first mode in response to sensing a normal operative condition of the NID and to assume the second mode in response to sensing an abnormal operative condition of the NID.

An aspect of a further embodiment is a safeguard circuit operable in a NID. The safeguard circuit includes an input node (such as to receive active branch signals from a splitter) and an output node (such as to supply active branch signals to the active signal conditioner). The safeguard circuit also includes a junction gate field-effect transistor (JFET); and a PIN diode. The drain node of the JFET is operably coupled to the PIN diode anode and to the input node. The gate node of the JFET is operably coupled through a gate resistor to ground. The JFET source is operably coupled to ground. The PIN diode cathode is operably coupled to the output node.

An aspect of another embodiment is a safeguard circuit operable in a NID. The safeguard circuit includes an input node and an output node. The safeguard circuit also includes one or more anode inductors; one or more shunt JFETs; one or more gate resistors; one or more cathode inductor resistors; one or more cathode inductors; and one or more PIN diodes. The drain node of the first JFET is operably coupled to the first PIN diode anode, to the input node and to the first cathode inductor end. The second cathode inductor end is operably coupled to a first voltage source. The gate node(s) of the JFET(s) is(are) operably coupled to the first gate resistor end and the second gate resistor end is operably coupled to a first ground point. The source node of the JFET is operably coupled to a first ground point and to first source inductor end, the second source inductor end is operably coupled to a first voltage source. The first cathode inductor end is operably coupled to the first PIN diode cathode and operably coupled to the output node. The second cathode inductor end is operably coupled to the first cathode resistor end. The second cathode resistor end is operably coupled to a first ground point. Additional JFETs may be used by cascading them between the first JFET and ground in the same configuration as the first JFET. Additional PIN diodes, inductors and resistors may be used by cascading them between the first PIN diode and the output node with each PIN diode stage connected to both an anode inductor and cathode inductor. The sequential PIN diodes may be employed in series or anti-series orientation employing decoupling caps as necessary to ensure proper biasing. In addition, subsequent JFETs may be replaced with alternate signal reduction circuitry such as the phase cancelation (damping) circuits described previously. Finally, all the resistors and inductors may be interchanged to ensure the optimization of the DC and RF parameters.

Additional features and advantages of the present disclosure are described in, and will be apparent from, the following Brief Description of the Figures and Detailed Description.

BRIEF DESCRIPTION OF THE DRAWINGS

The features described herein can be better understood with reference to the drawings described below. The drawings are not necessarily to scale. Emphasis, instead, is generally being placed upon illustrating the principles of the embodiments. In the drawings, like numerals are used to indicate like parts throughout the various views.

DETAILED DESCRIPTION

1. Network Interface Device—Switch-Based Phase Cancellation

Figure 1:
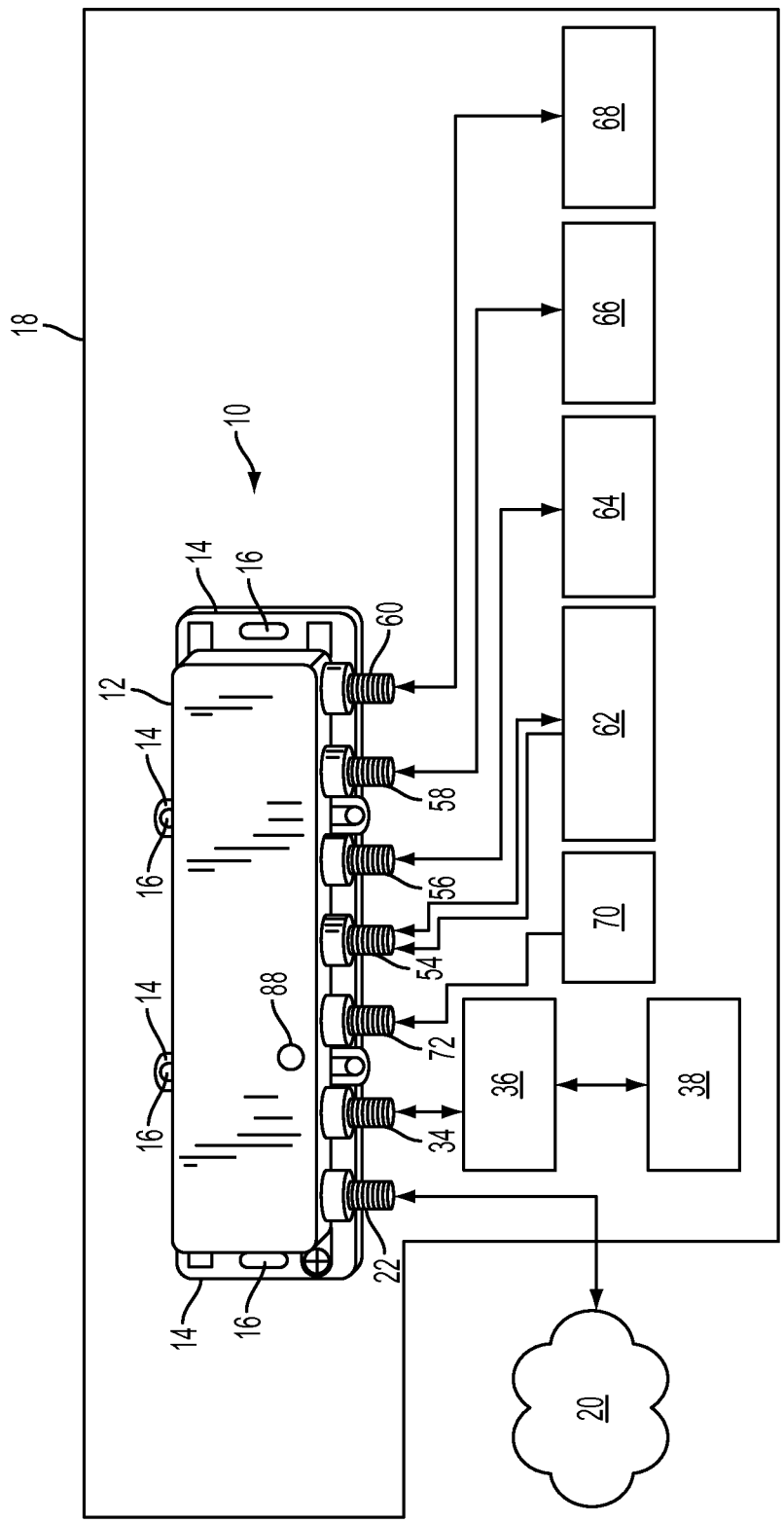
FIG. 1 depicts a perspective view of a network interface device according to one embodiment, shown connected to a cable network and subscriber devices, which are illustrated in block diagram form.

A network interface device 10 such as a passive-active network interface device which incorporates various embodiments is shown in FIG. 1. The network interface device 10 includes a housing 12 which encloses active and passive internal electronic circuit components (shown in FIGS. 2 and 3). A mounting flange 14 surrounds the housing 12, and holes 16 in the flange allow attachment of the network interface device 10 to a support structure at a subscriber premises 18. High-frequency downstream signals 19 are supplied from a head end (not shown) of a cable network 20, such as a CATV network, and the downstream signals 19 are delivered to the network interface device 10 at an input/output cable port 22 connected to the cable network 20.

Figure 2:
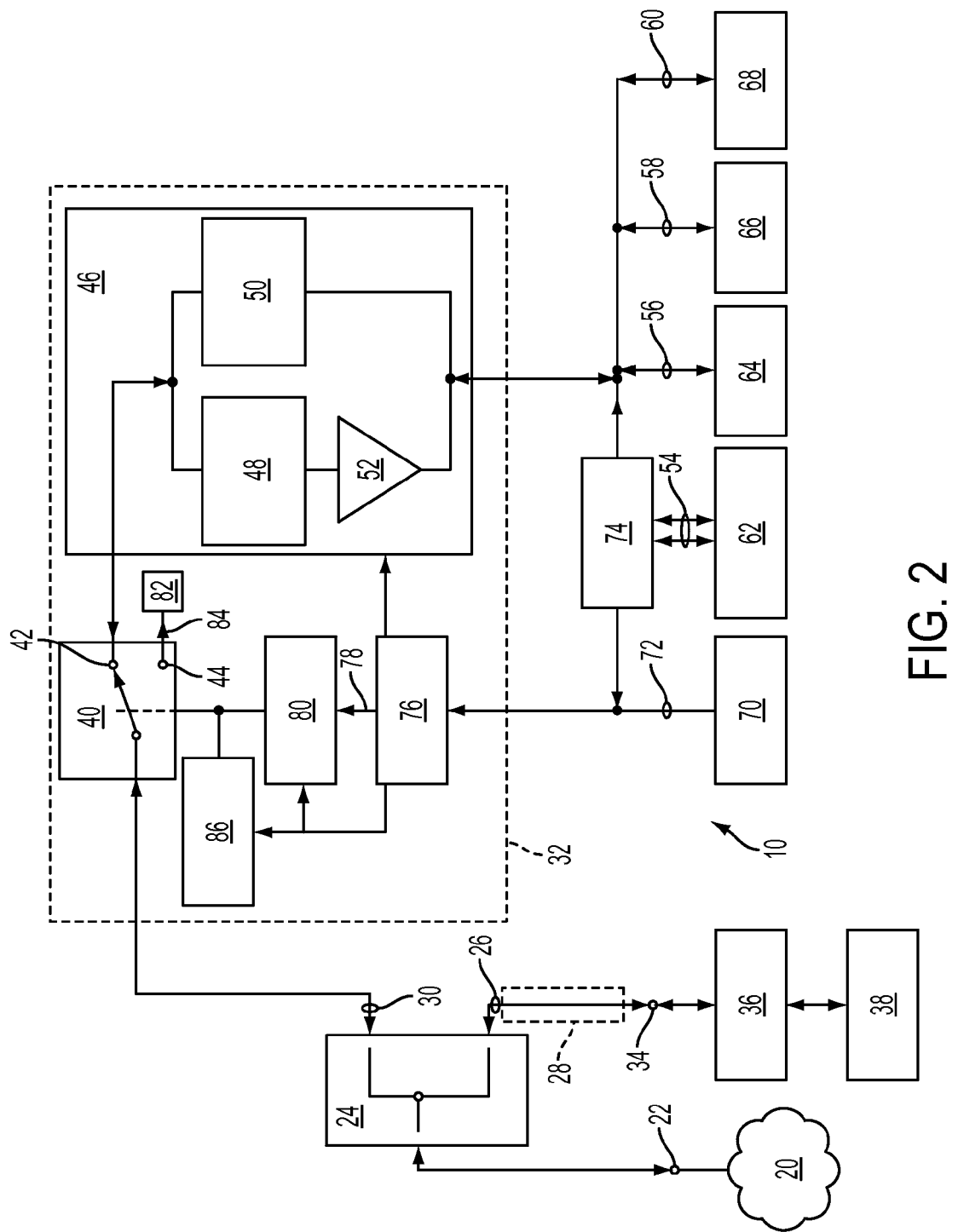
FIG. 2 depicts a block diagram of components within the network interface device shown in FIG. 1.

The passive and active internal electronic circuit components within the housing 12, shown in FIG. 2, include a conventional signal splitter, or directional coupler, 24 to communicate the CATV downstream signals 19 and upstream signals 25 with the CATV network 20. The signal splitter 24 separates the downstream signals 19 from the cable network 20 at the cable port 22 into passive branch signals 26, which are conducted through a passive branch circuit 28, and into active branch signals 30, which are conducted through an active branch circuit 32.

The passive branch signals 26 are delivered from a passive port 34 to those passive subscriber devices 36, 38 which respond to passive signals, such as a voice modem 36 connected to a telephone set 38, or an embedded multimedia network interface device (EMTA, not shown) which is located at the subscriber premises 18 (FIG. 1). The telephone set 38, the voice modem 36, and the EMTA, generate upstream signals 25 which are delivered to the passive port 34 and are conducted through the passive branch circuit 28 and the signal splitter 24 and are applied to the cable port 22 and conducted over the cable network 20 to the headend of the cable network.

Figure 3:
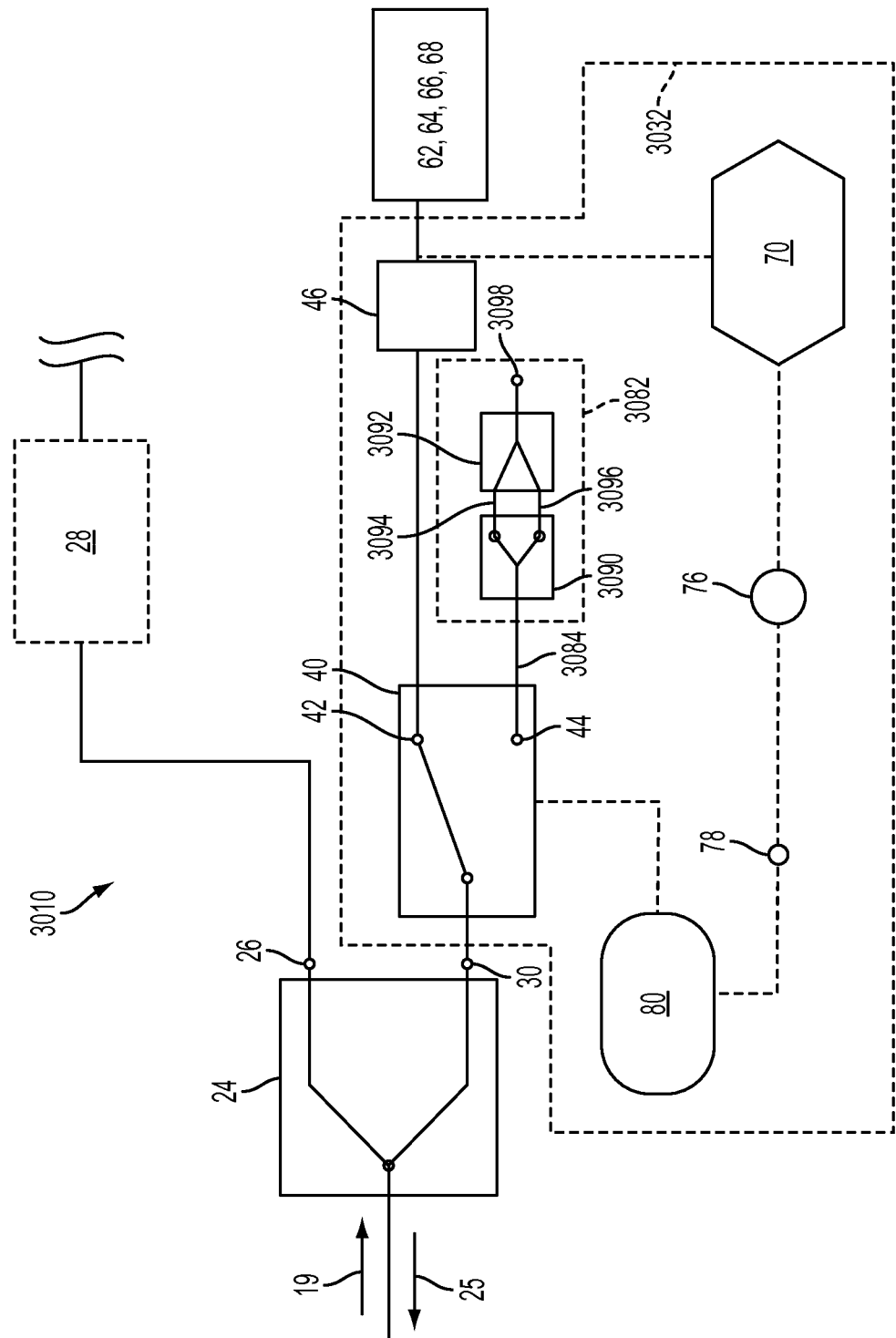
FIG. 3 depicts a block circuit diagram of the network interface device shown in FIG. 1, according to one embodiment.

The active branch signals 30 may be supplied to a selectable switch 40 such as a relay switch that has an activated, or powered, position 42 and a deactivated, or unpowered, position 44. When in its activated position 42 as shown in FIGS. 2 and 3, the selectable switch 40 conducts the active branch signals 30 to active branch circuitry 46 of the network interface device 10. The active branch circuitry 46 may include an analog downstream filter 48, an analog upstream filter 50 and at least one active signal conditioner 52, such as a linear amplifier. The analog downstream filter 48 filters the active branch signals 30 and supplies the filtered active branch signals 30 to the amplifier 52. The amplifier 52 amplifies the active branch signals 30 and supplies the amplified active branch signals 30 to at least one, but preferably, a plurality of the active ports 54, 56, 58, 60. The active ports 54, 56, 58 60 deliver the amplified, or conditioned, active branch signals 30 to active subscriber devices 62, 64, 66, 68 located at the subscriber premises 18 (FIG. 1), such as television sets (TV) and/or data modems. Other data processing devices, such as computers, (not shown) are connected to the data modems.

The equipment at the subscriber's premises typically generates upstream signals 25 which are supplied to the network interface device 10 for subsequent delivery to the headend of the cable network 20. The upstream signals 25 may be generated by any of the subscriber devices 62, 64, 66, 68 connected to any of the active ports 54, 56, 58 60. For example, one or more of the TV sets may have conventional set top boxes (not shown) associated with them to allow the subscriber/viewer to make programming and viewing selections. Of course, any computers connected to the data modems typically communicate upstream signals 25.

The upstream signals 25 from the devices at the subscriber's premises 18 may be amplified by an active signal conditioner 52, such as a reverse amplifier or reverse signal conditioner, of the network interface device 10, before those amplified upstream signals 25 are delivered to the selectable switch 40, the signal splitter 24, the cable terminal 22 and the cable network 20. Amplifying the upstream signals 25 is optional, since the upstream signals 25 from subscriber devices 62, 64, 66, 68 are often passively transmitted without amplification through the active branch circuit 32 to the cable network 20. If a reverse amplifier or reverse signal conditioner is employed in a network interface device 10, such a device is connected in series with the analog upstream filter 50 to create an amplifying effect.

Electrical power for the active branch circuitry 46 and other components of the network interface device 10 is supplied from a conventional DC power supply 70 connected to a dedicated power input port 72. Alternatively, electrical power can be supplied through a conventional power inserter that is connected to the port 54. The power inserter allows relatively low voltage DC power to be conducted through the same port that also conducts the high-frequency signals, which in the situation shown in FIGS. 1 and 2, is the port 54. A power-signal divider 74 separates the high-frequency signals from the low voltage DC power and conducts the high-frequency signals to the active branch circuitry 46 and conducts the low voltage DC power to the same point that power is supplied from the dedicated port 72. Thus, regardless of whether electrical power is supplied through either one of the ports 54 or 72, the DC power operates the active components of the network interface device 10.

Use of a conventional power inserter connected to one of the ports, such as port 54, eliminates the need for a separate dedicated power supply port 72, or provides an alternative port through which electrical power can also be applied. The power supply 70 or the power supplied from the port 54 is typically derived from a conventional wall outlet (not shown) within the subscriber premises 18.

The ports 22, 34, 54, 56, 58 and 60 and 72 preferably comprise a conventional female coaxial cable connector (shown in FIG. 1) which is mechanically connected to the housing 12 (FIG. 1) and which is electrically connected to certain internal components (FIGS. 2 and 3) of the network interface device 10. Using a female coaxial cable connector for the ports 22, 34, 54, 56, 58 and 60 and 72 facilitates connecting coaxial cables (not shown) to the network interface device 10, by mechanically connecting the corresponding mating male coaxial cable connector (not shown) on the coaxial cable to the female coaxial cable connectors forming the ports 22, 34, 54, 56, 58 and 60 and 72.

The illustrated embodiment automatically improves return loss by preventing excessive signal reflections which affect downstream signals 19 and upstream signals 25 passing through the passive branch circuit 28, in the event that the components of the network interface device 10, principally those of the active circuitry 46, become inoperative or abnormally operative. An inoperative or abnormally operative condition changes the impedance of the active circuitry 46, causing downstream signals 19 and upstream signals 25 to reflect back from the active circuitry 46 into the signal splitter 24, where those reflected signals interfere with and degrade the characteristics of the passive branch signals 26.

The proclivity for high-frequency signals to reflect is related to the impedance characteristics of the termination of the conductor which conducts those signals and to the frequency of those signals. For this reason, coaxial cables are typically terminated by connecting a terminating impedance between the signal-carrying center conductor and the surrounding reference plane shielding which has a terminating impedance value equal to a characteristic impedance between the signal-carrying conductor and the reference plane shielding. When the active circuitry 46 becomes inoperative or abnormally operative, the impedance of the active circuitry 46 enters an unintended and unanticipated state and causes significantly increased signal reflections, which leads to significantly degraded return loss. Return loss refers to the degradation of incident signals caused by reflected signals. An increase in the amount of the reflected signals increases the degradation of the incident signals, thereby causing a loss in the quality or fidelity of the incident signals. A degraded return loss equates to more downstream signal reflection. Improving the return loss maximizes the quality and fidelity of the downstream signals.

The active circuitry 46 enters an unanticipated impedance state, which alters the impedance of the active circuitry 46, if the network interface device 10 becomes inoperative as a result of losing its supply of applied electrical power or losing an adequate supply of applied electrical power. Under such circumstances the voltage from the power supply diminishes. A power loss of this nature may result from a failed power supply 70, or a disconnection or breakage in the conductor which supplies the electrical power from the power supply to one of the power input ports 72 or 54.

The active circuitry also enters an unanticipated impedance state, which alters the impedance of the active circuitry 46, if a component of the network interface device 10 fails and causes it to consume an excessive amount of current, as would occur if a component failure caused a short circuit, or if a component of the network interface device 10 fails and causes it to consume a diminished amount of current, as would occur if a component failure caused an open circuit. The current drawn by the active circuitry 46 increases if the amplifier 52 enters a short-circuit condition, and the current drawn by the active circuitry 46 decreases if the amplifier 52 enters an open-circuit condition. Even if some other circuit component of the active circuit 46 becomes defective, that other circuit component has the potential of adversely affecting the amplifier 52, and may cause the amplifier 52 to consume more or less current than it would normally supply.

In one embodiment, a sensor 76, shown in FIG. 2, responds to changes in the voltage of the power supplied and/or to changes in the current consumed by the network interface device 10. Under inoperative or abnormally operative conditions, the sensor 76 sends a control signal 78 to a control circuit 80 such as a switch driver. The control circuit 80 responds to the control signal 78 by causing the selectable switch 40 to disconnect the active circuitry 46 from the active branch circuit 32 and conduct the active branch signals 30 to a phase cancellation circuit 82. In one embodiment, the selectable switch 40 assumes the activated position 42 in response to the assertion of the control signal 78 and communicates the active branch signals 30 between the CATV network 20 and the active subscriber devices 62, 64, 66, 68. The selectable switch 40 assumes the deactivated position 44 in response to the de-assertion of the control signal 78 and conducts the active branch signals 30 to a signal reduction path 84 to which the phase cancellation circuit 82 is connected.

The phase cancellation circuit 82 phase-shifts the active branch signals 30 out of phase and then reinserts them in-line to essentially cancel the potentially reflected signals. In one embodiment, the phase cancellation circuit 82 splits the active branch signals into a reference signal and a phase-delayed signal that is out of phase with respect to the reference signal. In one example, the phase-delayed signal is 180 degrees out of phase with respect to the reference signal. The phase cancellation circuit 82 then recombines the phase-delayed signal and the reference signal to a single, reduced active branch signal that minimizes the signal reflections into the signal splitter 24 and the cable network 20, thereby improving the return loss and preserving the characteristics of the passive branch signals 26 conducted in the passive branch 28.

By preserving the characteristic of the passive branch signals 26, the very important or essential passive subscriber devices 36, 38, such as a lifeline telephone set 38, will continue to operate without a substantial decrease in performance. Maintaining the telephone set 38 in a functional state is important in assuring the subscriber access to effective communication in emergency and urgent situations, as well as generally permitting high-fidelity voice communications under circumstances where an abnormally operative condition of the active circuitry 46 would prevent high-fidelity voice communications.

Of course when the active circuitry 46 is disconnected, active signals are not conducted to the active subscriber devices 62, 64, 66, and 68. High-quality signals would not be available to these active subscriber devices 62, 64, 66, 68 in any event because the inoperative or abnormally operative condition of the terminal adapter. The active subscriber devices 62, 64, 66, 68 connected to the active ports 54, 56, 58 and 60 are considered expendable in operation in order to preserve the more critical functionality of lifeline passive telephone communications through the telephone set 38.

Under normal operative conditions, the selectable switch 40 is held in its activated position shown in FIG. 2. Under inoperative or abnormally operative conditions, the control circuit 80 does not supply energy to hold the selectable switch 40 in the activated position shown in FIG. 2, but instead the selectable switch 40 naturally moves under the influence of its own internal mechanical bias to the alternative deactivated position (not shown) where the phase cancellation circuit 82 is connected in substitution for the active circuitry 46 in the active branch circuit 32.

When normal power delivery resumes and when power is normally supplied, the control circuit 80 will move the selectable switch 40 to the activated position shown in FIG. 2. However, it is unlikely that a component failure or degradation will be temporary, so it is unlikely that the network interface device 10 will resume normal operation after an excessive amount of current is consumed due to a failed or degraded component or after a minimal amount of current is consumed due to a failed or degraded component.

An indicator 86 may be attached to the control circuit 80. Whenever the control circuit 80 holds the selectable switch 40 in the activated position shown, the indicator 86 delivers an indication of normal functionality, such as a green light. Whenever the control circuit 80 allows the selectable switch 40 to connect the phase cancellation circuit 82 in substitution for the active circuitry 46, the indicator 86 delivers a different type of indication, such as a red light, which indicates an inoperative or abnormally operative condition. Of course, if there is a lack of power to the network interface device 10, the indicator 86 will not deliver any type of indication. The lack of any indication itself indicates a loss of power. The indicator 86 delivers the indication through a view window 88 in the housing 12 (FIG. 1).

Turning to FIG. 3, one embodiment of a network interface device 3010 including a signal splitter, or directional coupler, 24 to handle the CATV downstream signals 19 and upstream signals 25 is shown. The signal splitter 24 separates the downstream signals 19 into passive branch signals 26, which are conducted through a passive branch circuit 28, and into active branch signals 30, which are conducted through an active branch circuit 3032. The active branch signals 30 may be supplied to a selectable switch 40 such as a relay switch that has an activated, or powered, position 42 and a deactivated, or unpowered, position 44.

The network interface device 3010 includes a phase cancellation circuit 3082 realized as a first signal divider element 3090 in electrical series with a first signal coupling element 3092. The first signal divider element 3090 receives the active branch signals 30 and conducts them to the signal reduction path 3084 where the active branch signals 30 are divided into a reference signal 3094 and a phase-delayed signal 3096. In one example, a phase shift element (not shown) applies a 180-degree phase shift to the phase-delayed signal 3096. The reference signal 3094 and the 180-degree phase-delayed signal 3096 are then recombined at the first signal coupling element 3092, which in one example is a 0-degree combiner, resulting in a reduced active branch signal 3098 that is reduced in amplitude to a degree that will not cause detrimental reflections. The reduced active branch signal 3098 may be open, short or terminated.

Figure 4:
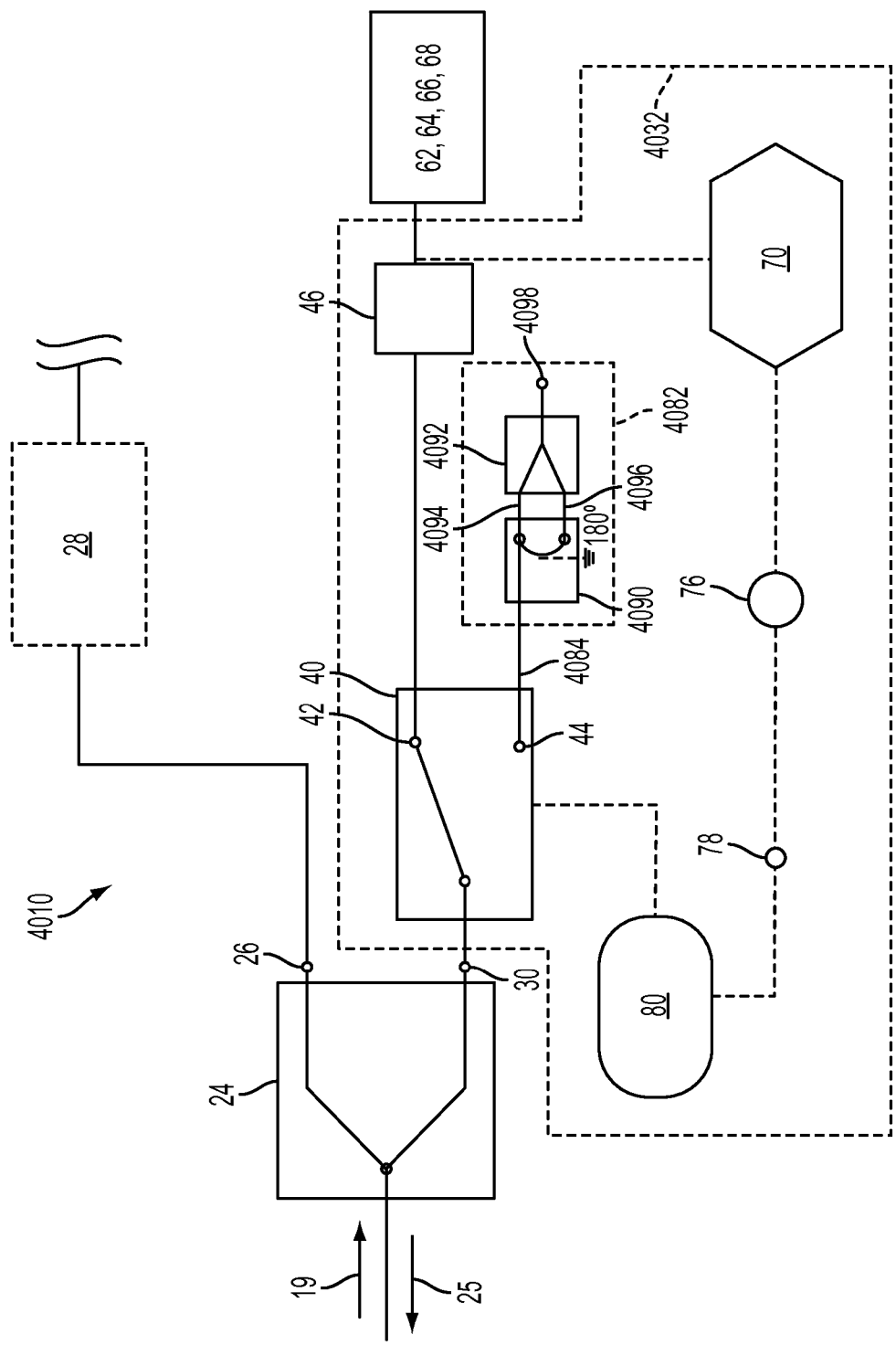
FIG. 4 depicts a block circuit diagram of the network interface device shown in FIG. 1, according to another embodiment.

Turning now to FIG. 4, another embodiment of a network interface device 4010 including a signal splitter 24 to handle the CATV downstream signals 19 and upstream signals 25 is shown. The signal splitter 24 separates the downstream signals 19 into passive branch signals 26, which are conducted through a passive branch circuit 28, and into active branch signals 30, which are conducted through an active branch circuit 4032. The active branch signals 30 may be supplied to a selectable switch 40 such as a relay switch that has an activated, or powered, position 42 and a deactivated, or unpowered, position 44.

The network interface device 4010 includes a phase cancellation circuit 4082 realized as a balun transformer 4090 in series with a first signal coupling element 4092. The balun transformer 4090 joins an unbalanced line (e.g., one that has one conductor and a ground, such as a coaxial cable) to a balanced line (e.g., one that has two conductors with equal currents in opposite directions). In the disclosed embodiment, the balun transformer 4090 is a 1:1 transformer, having no impedance transformation, and converts the active branch signal 30 from the signal reduction path 4084 into a reference signal 4094 and a phase-delayed signal 4096 that is equal in magnitude and opposite in phase (e.g., 180 degrees) with respect to the reference signal 4094. The balanced output 4094, 4096 of the balun transformer 4090 is then recombined at a first signal coupling element 4092, which in the disclosed example is a 0-degree combiner, resulting in a reduced active branch signal 4098 that is reduced in amplitude to a degree that will not cause detrimental reflections. In one example, the phase cancellation circuit 4082 provides a return loss characteristic better than 20 dB.

Figure 5A:
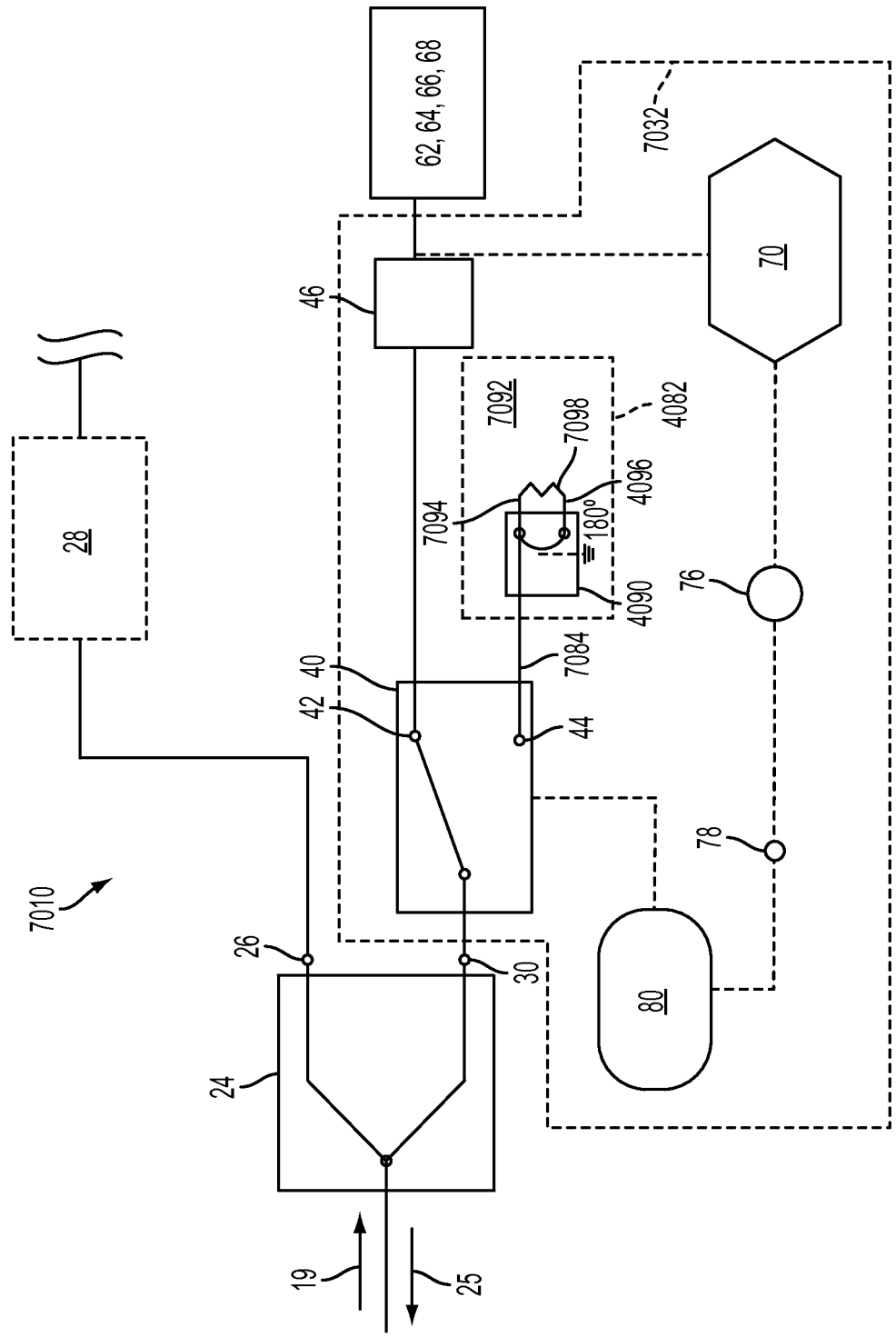
FIG. 5A depicts a block circuit diagram of the network interface device show in FIG. 1, according to yet another embodiment.

Turning now to FIG. 5A, another embodiment of a network interface device 7010 including a signal splitter 24 to handle the CATV downstream signals 19 and upstream signals 25 is shown. The signal splitter 24 separates the downstream signals 19 into passive branch signals 26, which are conducted through a passive branch circuit 28, and into active branch signals 30, which are conducted through an active branch circuit 7032. The active branch signals 30 may be supplied to a selectable switch 40 such as a relay switch that has an activated, or powered, position 42 and a deactivated, or unpowered, position 44.

The network interface device 7010 includes a phase cancellation circuit 7082 realized as a balun transformer 7090 with a transform matched resistance across its outputs 7094, 7096. The balun transformer 7090 joins an unbalanced line (e.g., one that has one conductor and a ground, such as a coaxial cable) to a balanced line (e.g., one that has two conductors with equal currents in opposite directions). In the disclosed embodiment, the balun transformer 7090 may be one of a 1:1, 1:2, 1:3 . . . or 1:n transformer, having a respective impedance transformation, and converts the active branch signal 30 from the signal reduction path 7084 into a reference signal 7094 and a phase-delayed signal 7096 that is equal in magnitude and opposite in phase (e.g., 180 degrees) with respect to the reference signal 7094. The balanced output 7094, 7096 of the balun transformer 7090 is then recombined at the resistive element 7092, resulting in a reduced active branch signal 7098 that is reduced in amplitude to a degree that will not cause detrimental reflections. In one example, the phase cancellation circuit 7082 provides a return loss characteristic better than 20 dB.

Figure 5B:
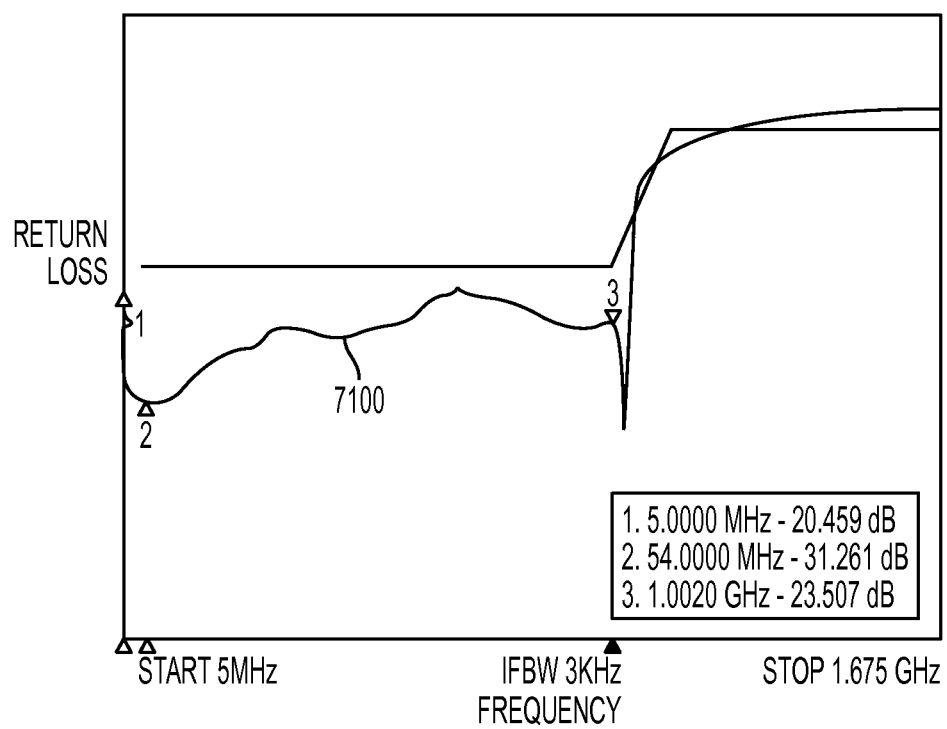
FIG. 5B depicts a graphical representation of the return loss characteristics of the circuit shown in FIG. 5A.

FIG. 5B depicts a graphical representation of the return loss characteristics of the circuit 32 shown in FIG. 5A when the selectable switch 40 is in its deactivated state 44. The return loss response 7100 is approximately 20 dB or better throughout the CATV range of frequencies (e.g., 5-1002 MHz).

Figure 6A:
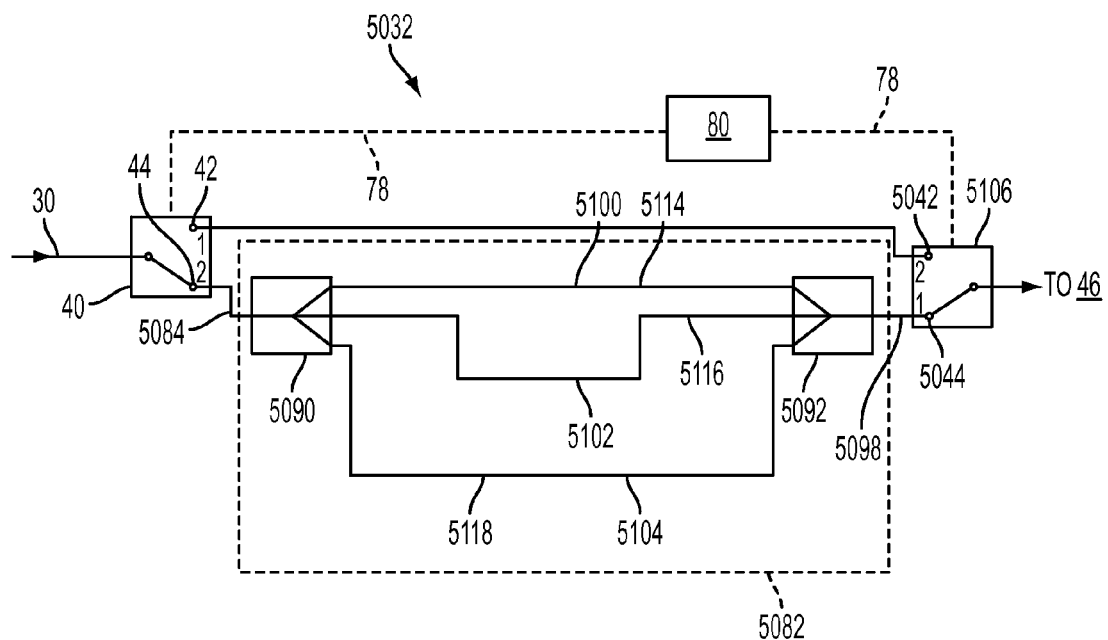
FIG. 6A depicts a block circuit diagram of the network interface device shown in FIG. 1, according to yet another embodiment.

Turning now to FIG. 6A, one noted problem with phase cancellation circuitry is that the cancellation generally tends to work well in a fairly narrow band of frequencies. To overcome this deficiency and permit cancellation in the entire CATV spectrum, a phase cancellation circuit 5082 is provided in which electrical paths of differing electrical lengths are utilized to provide different phase delays. The phase cancellation circuit 5082 includes a first selectable switch 40 as described hereinabove. The first selectable switch 40 may be a relay switch that has an activated, or powered position, 42 and a deactivated, or unpowered, position 44. When the control circuit 80 de-asserts the control signal 78, the first selectable switch 40 assumes the deactivated position 44, thus passing active branch signal 30 to the signal reduction path 5084. The active branch signal 30 is received by a first signal divider element 5090, which in the illustrated embodiment is a 3-way signal splitter. The signal splitter 5090 divides the active branch signal 30 into three signal components on three electrical paths: a first signal component 5100 on an electrical path 5114 having a first, or reference, electrical length, a second signal component 5102 on an electrical path 5116 having a second electrical length, and a third signal component 5104 on an electrical path 5118 having a third electrical length. Each of the electrical lengths of the electrical paths 5114, 5116, 5118 differ, having the practical effect of phase-delaying each of the signal components 5100, 5102, 5104.

The phase-delayed signal components 5100, 5102, 5104 are recombined at a first signal coupler 5092 which, in one example, is a 0-degree coupler. The recombined active branch signal 5098 is reduced in amplitude to a degree that will not cause detrimental reflections. The electrical length refers to the distance over which a signal component 5100, 5102, 5104 travels the electrical path 5114, 5116, 5118 between the signal splitter 5090 and the first signal coupler 5092. The electrical length is, in one example, the length of the trace on the board that carries the signal components 5100, 5102, 5104.

In the depicted schematic diagram, the recombined active branch signal 5098 may be received at a second switch 5106. Similar to the first selectable switch 40, the second switch 5106 may be a relay switch that has an activated, or powered position, 5042 and a deactivated, or unpowered, position 5044. The second switch 5106 assumes the activated position 5042 in response to the assertion of the control signal 78 from the control circuit 80. When in its activated position 5042, the second switch 5106 conducts the active branch signal 30 to the active branch circuitry 46. In response to the de-assertion of the control signal 78, the second switch 5106 assumes the deactivated position 5044 as shown in FIG. 5A.

Figure 6B:
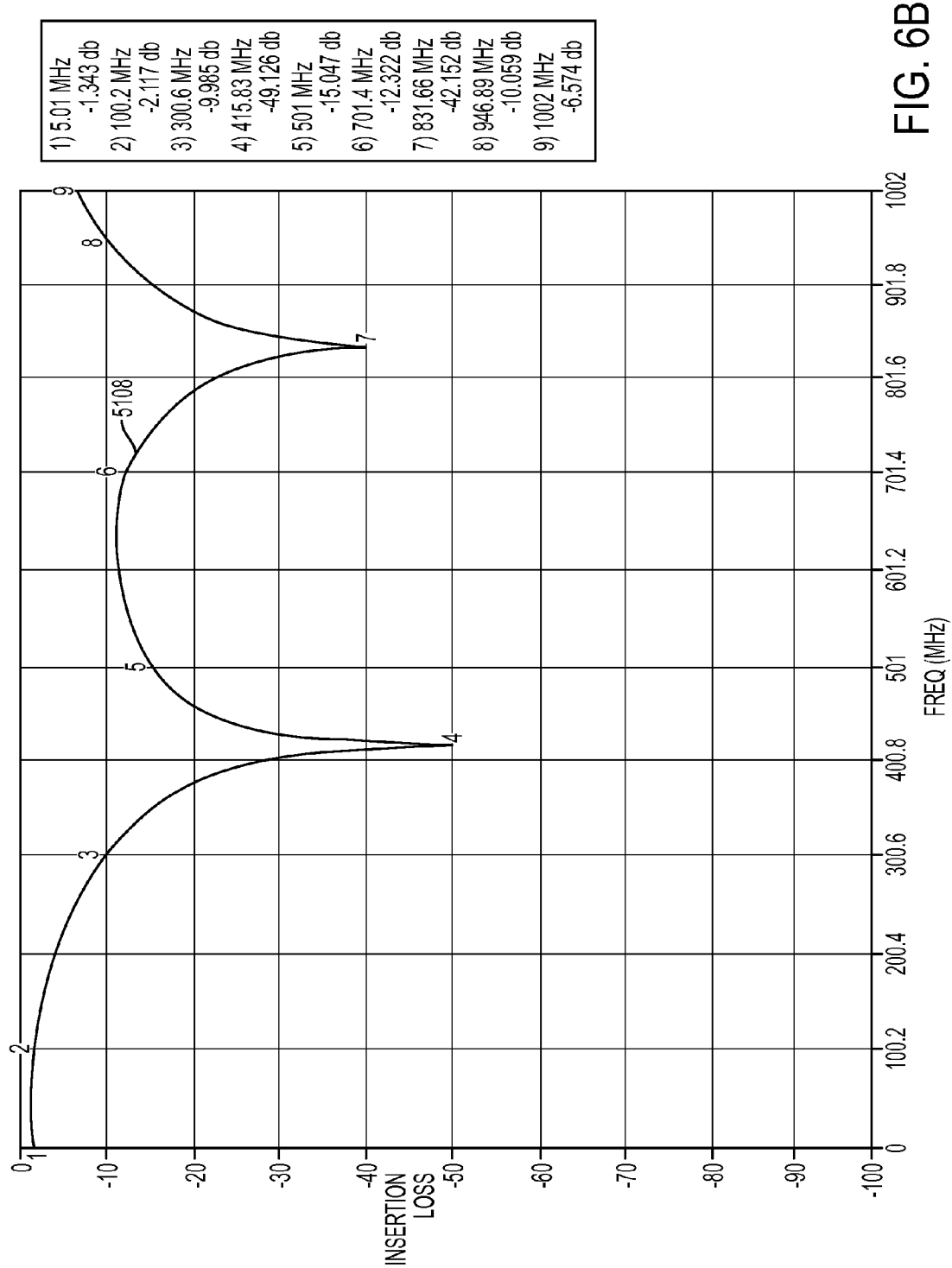
FIG. 6B depicts a graphical representation of the insertion loss characteristics of the circuit shown in FIG. 6A.

FIG. 6B depicts a graphical representation of the insertion loss characteristics of the active branch circuit 5032 shown in FIG. 6A when the first selectable switch 40 and the second selectable switch 5106 are in their respective deactivated states 44, 5044. The insertion loss response 5108 is approximately −10 dB or better throughout the CATV range of frequencies (e.g., 54-1002 MHz).

Figure 6C:
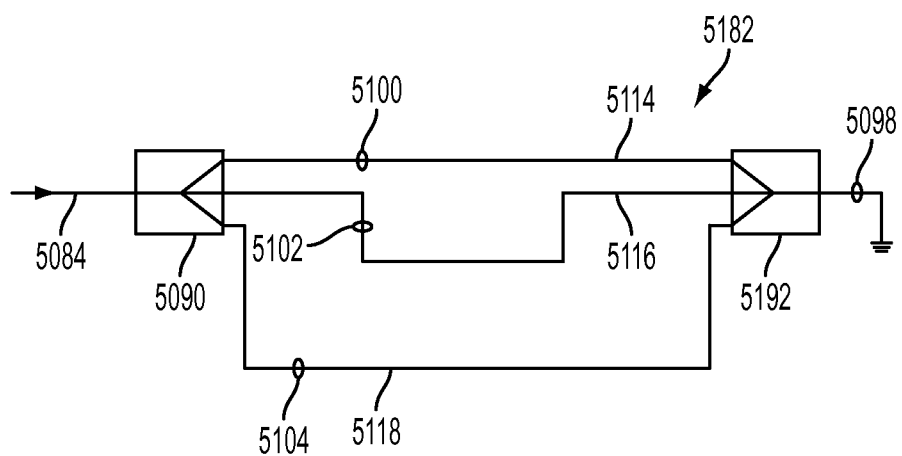
FIG. 6C depicts the block circuit diagram of the network interface device shown in FIG. 6A in a shorted state.
Figure 6D:
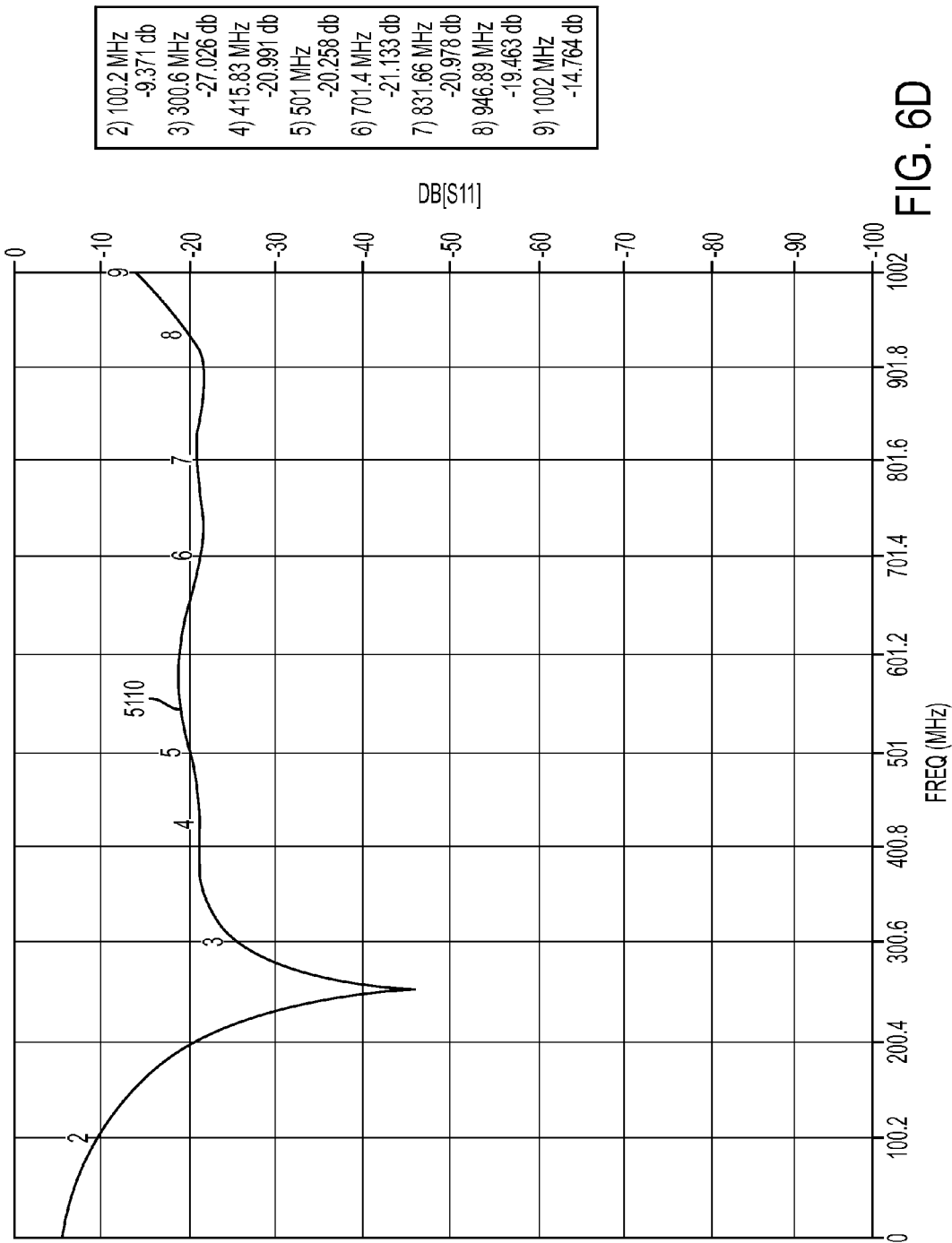
FIG. 6D depicts a graphical representation of the return loss characteristics of the circuit shown in FIG. 6C.

FIG. 6C depicts the block circuit diagram of a phase cancellation circuit 5182, which may be used in the active branch circuit 5032 of FIG. 6A, tied to ground for a shorted state. Stated another way, the reduced active branch signal 5098 is terminated to ground. FIG. 6D depicts a graphical representation of the return loss characteristics of the circuit shown in FIG. 6C. The return loss response 5110 is approximately −20 dB or better throughout the CATV range of frequencies, which is adequate to minimize the reflections into the passive subscriber devices 36, 38.

Figure 6E:
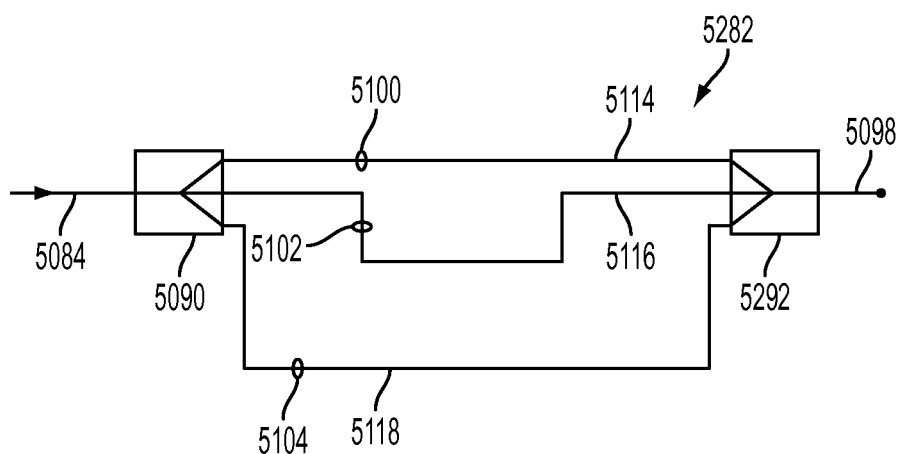
FIG. 6E depicts the block circuit diagram of the network interface device shown in FIG. 6A in an open state.
Figure 6F:
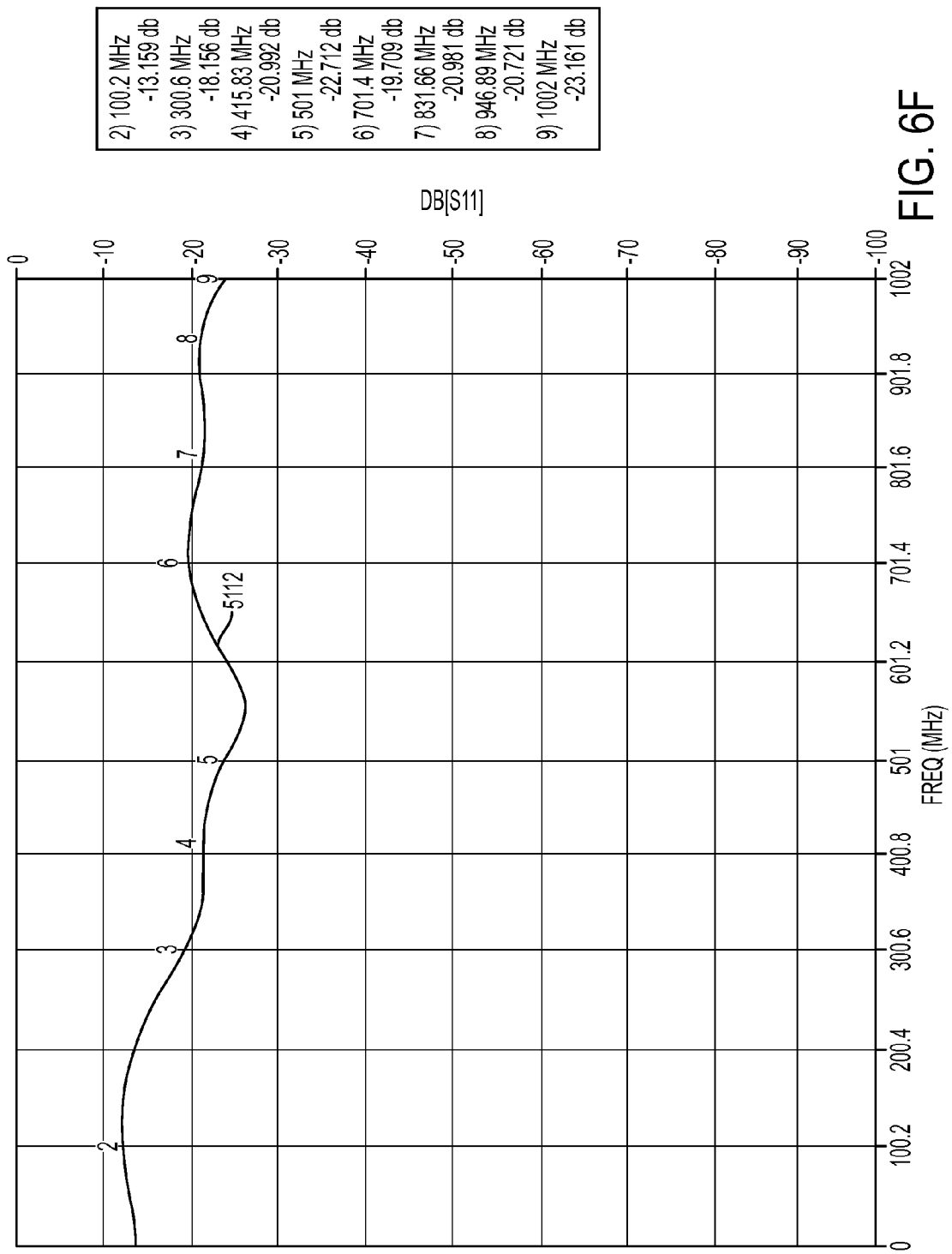
FIG. 6F depicts a graphical representation of the return loss characteristics of the circuit shown in FIG. 6E.

FIG. 6E depicts the block circuit diagram of the phase cancellation circuit 5282, which may be used in the active branch circuit 5032 of FIG. 5A, tied to an open state. Stated another way, the reduced active branch signal 5098 is open to ground. FIG. 6F depicts a graphical representation of the return loss characteristics of the circuit shown in FIG. 6E. The open return loss response 5112 is approximately −20 dB or better throughout the CATV range of frequencies, which is adequate to minimize the reflections into the passive subscriber devices 36, 38.

Figure 7:
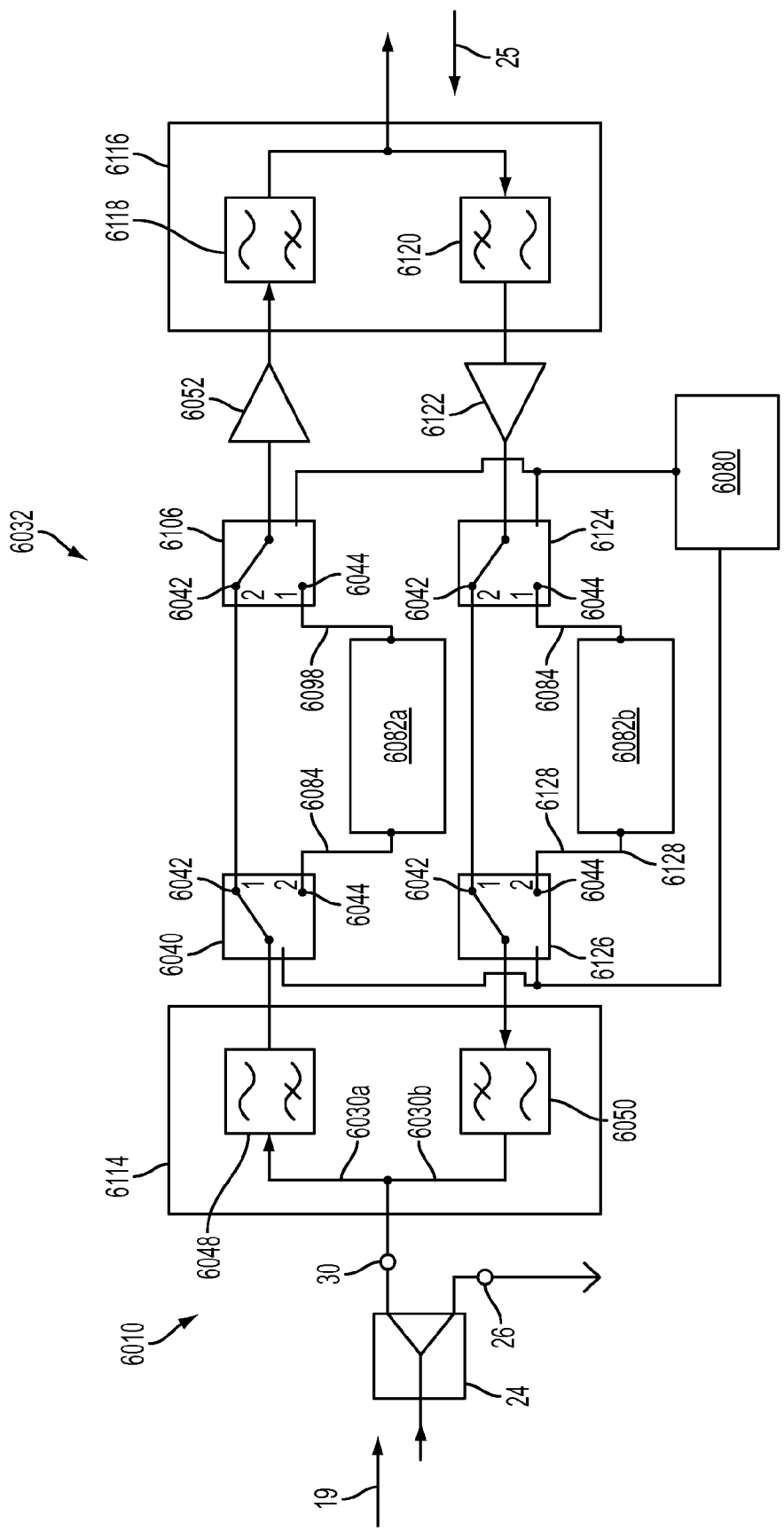
FIG. 7 depicts a block circuit diagram of the network interface device shown in FIG. 1, according to yet another embodiment.

FIG. 7 depicts a block circuit diagram of a network interface device 6010 according to another embodiment. The network interface device 6010 includes diplexer filters 6048, 6050, 6118, 6120 to isolate the active branch downstream signals 6030a and active branch upstream signals 6030b on the active branch circuit 6032, and provides a downstream phase cancellation circuit 6082a and an upstream phase cancellation circuit 6082b. The phase cancellation circuits 6082a, 6082b may be realized as any of the embodiments disclosed hereinabove and may each be configured differently in a given active branch circuit 6032. The network interface device 6010 includes a signal splitter 24 to communicate CAN downstream signals 19 and upstream signals 25 with the CATV network 20. The signal splitter 24 separates the downstream signals 19 into passive branch signals 26 and active branch signals 30. A first filter circuit 6114, which is realized as a diplexer circuit in the illustrated embodiment, includes a first high pass filter 6048 for passing the active branch downstream signals 6030a and a first low pass filter 6050 for passing the active branch upstream signals 6030b. In the disclosed embodiment, the high pass filter 6048 allows active branch downstream signals 6030a in the CATV band to pass, but attenuates active branch downstream signals 6030a in any other frequency. In one example, the high pass filter 6048 passes active branch downstream signals 6030a in the 54-1,002 MHz range. The first low pass filter 6050 allows active branch upstream signals 6030b in the CATV band to pass, but attenuates active branch upstream signals 6030b in any other frequency. In one example, the first low pass filter 6050 passes active branch upstream signals 6030b in the 5-42 MHz range.

The high pass filter 6048 connects to a first selectable switch 6040 such as a relay that is activated by control circuit 6080, as previously described. When the first selectable switch 6040 is in an activated position 6042, the filtered downstream signals 6030a pass to an activated position 6042 of a second selectable switch 6106, allowing the filtered downstream signals 6030a to pass to a downstream signal conditioner 6052, such as an amplifier.

When the first selectable switch 6040 is in a de-activated position 6044, the first selectable switch 6040 conducts the downstream signals 6030a to a signal reduction path 6084 to which the downstream phase cancellation circuit 6082a is connected. In one example, the reduced CATV downstream signal 6098 output from the downstream phase cancellation circuit 6082a connects to the deactivated position 6044 of the second selectable switch 6106. Alternatively, the reduced CATV downstream signal 6098 may be open, shorted, or terminated to ground (not shown).

The network interface device 6010 may further include a second filter circuit 6116 on the subscriber-side of the active branch circuit 6032, which is realized as a diplexer circuit in the illustrated embodiment. The second filter circuit 6116 includes a second high pass filter 6118 for passing the downstream signals 6030a and a second low pass filter 6120 for passing the upstream signals 6030b. In the disclosed embodiment, the second high pass filter 6118 passes downstream signals 6030a having the same frequency range as the high pass filter 6048, namely downstream signals 6030a in the 54-1,002 MHz range. The second high pass filter 6118 connects to the amplified downstream signal 6030a output of the active signal conditioner 6052.

The second low pass filter 6120 allows upstream signals 6030b in the CATV band to pass, but attenuates upstream signals 6030b in any other frequency. In one example, the first low pass filter 6050 passes upstream signals 6030b in the 5-42 MHz range. The second low pass filter 6120 may connect to an upstream signal conditioner 6122, such as an amplifier. The amplifier 6122 connects the amplified upstream signals 6030b to a first low pass switch 6124, such as a relay, that is also activated by the control circuit 6080. When the first low pass switch 6124 is in an activated position 6042, the filtered upstream signals 6030b pass to an activated position 6042 of a second low pass switch 6126, allowing the upstream signals 6030b to pass to the first low pass filter 6050.

When the first low pass switch 6124 is in a de-activated position 6044, the first low pass switch 6124 conducts the upstream signals 6030b to a signal reduction path 6084 to which the upstream phase cancellation circuit 6082b is connected. In one example, a reduced CATV upstream signal 6128 output from the upstream phase cancellation circuit 6082b connects to the deactivated position 6044 of the second low pass switch 6126. Alternatively, the reduced CATV upstream signal 6128 may be open or terminated to ground (not shown).

One advantage to the network interface device 6010 shown in FIG. 7 is that each phase cancellation circuit 6082a, 6082b may be designed to minimize reflections in a more narrow frequency range, thereby achieving better performance.

In the block diagrams depicted in FIGS. 6A, 6C, 6E, and 7, according to another embodiment, the secondary switches 5042, 5206, 5306, 6106, 6124 may be omitted from the active branch circuit 5032, 6032. Instead, the traces between the activated position 5042, 6042 and the output of the secondary switches 5042, 5206, 5306, 6106, 6124 may be connected to provide the normal operational signal path through the active branch circuit 5032, 6032. In addition, when the selectable switches 40, 6044, and 6126 are in the deactivated position, the reduced CATV signals 6098, 6128 from the phase cancellation circuits 6082a, 6082b may be open, shorted, or terminated to ground (not shown).

2. Network Interface Device—Solid-state Safeguard Apparatus

In one embodiment, the NID 800 includes all of the components, structure, logic and elements of NIDs described above except that the selectable relay switches and phase cancellation circuits of such NIDs are replaced with the safeguard circuit or safeguard apparatus 840 illustrated in FIG. 800.

When an undesirable event occurs, such as a power loss, power degradation or power surge, the NID 800 continues operation in passive mode. The passive mode operation provides a continued source of passive signals derived from radio or high-frequency signals over cable networks, such as CATV networks. The passive signals include non-amplified signals of a relatively low strength, such as signals in the strength range of −10 to 12 dBmV. The passive signals are sufficient to operate certain subscriber devices, including, but not limited to, Voice Over Internet Protocol (VOIP) telephones, VOIP communication devices and voice modems. In one embodiment, the passive communications paths of such subscriber devices include lifeline, essential or critical communication paths because these paths are relied upon for emergency communications, such as 911 calls for communications with police and fire departments.

The safeguard apparatus 840 helps maintain the integrity of the passive communication path effectively isolating it from the active path during disruptive conditions, such as loss or lack of power or other failure mode within the NID device. Additionally, the safeguard apparatus 840 has a self-damping effect to eliminate the need for additional external circuits or components. Furthermore, in one embodiment, the safeguard apparatus 840 handles multiple functions within a single, more reliable, relatively compact module with no moving or electromechanical parts (such as electromechanical switches). Such an apparatus is a solid-state configuration (or static configuration).

In contrast, traditional relay switches rely on electromechanical elements to physically change the electrical circuit. Thus, they may not be considered solid-state configurations.

As noted above, inoperative or abnormally operative conditions change the impedance of the active circuitry 46, causing downstream signals 19 and upstream signals 25 to interfere with and degrade the characteristics of the passive branch signals 26. Through its discrete structure, the safeguard apparatus 840 has the equivalent functionality of a controllable single pole, double throw (SPDT) switch or relay with an inherent damping (absorptive) circuit which can re-route branch signals from the splitter to either of two paths, the normal active branch path and the abnormal damping (absorptive) path. During normal operation the safeguard apparatus routes branch signals through the active path with minimal impact on insertion loss or linearity. During abnormal operation the safeguard apparatus opens the active branch (isolating the active circuit from the passive circuit) and routes all active branch signals (coming from the input or VOIP ports) through its inherently lossy structure preventing any disruptive reflections from returning to the passive path.

In one embodiment, the safeguard circuit or apparatus 840 has a structure based on a collection of active and passive components. Such components are operable to control changing between the following two modes of operation: 1) a first mode (such as a normal, powered or typical mode) which provides a low loss, high linearity, high reliability RF path to an active communication path and 2) a second mode (such as an abnormal, unpowered or atypical mode) which safeguards the return loss and linearity of a passive communication path. The second mode is used during disruptive operating conditions (such as but not limited to low voltage, low current, high current, and power loss for example).

Figure 8:
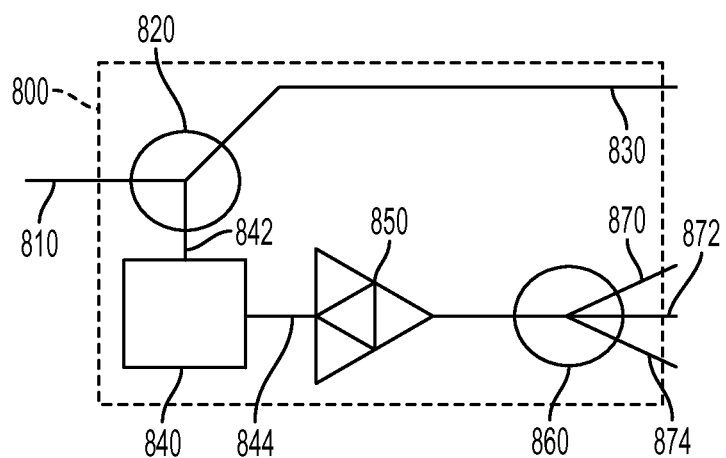
FIG. 8 is a simplified block diagram of another network interface device in accordance with an embodiment.

Referring to FIG. 8, NID 800 has an input 810 operable to receive CATV signals from a headend. A splitter/directional coupler 820 separates the CATV signals into active path communications (or active signals) and passive path communications (or passive signals). The passive path communications (such as critical or essential path communications or emergency telephone signals) are sent to a passive device 830, such as a VoIP telephone.

The active signals are sent through a safeguard apparatus 840. The safeguard circuit input 842 receives the active path communications from the splitter/directional coupler 820 and supplies the active path communications to an active branch conditioner (such as downstream/upstream amplifier 850) at safeguard circuit output 844. A second splitter 860 then separates the active signals to amplified outputs 870, 872, 874 for reception by active devices.

In one embodiment, the safeguard apparatus 840 includes a plurality of JFETs and PIN diodes which provide a controllable circuit for changing communication paths from throughput to absorptive. The communication path may operate in a throughput mode during normal operational conditions. When atypical operational conditions are detected, the communication path may be changed to an absorptive mode to ensure the quality of a second communication path (such as a passive communication path).

Figure 9:
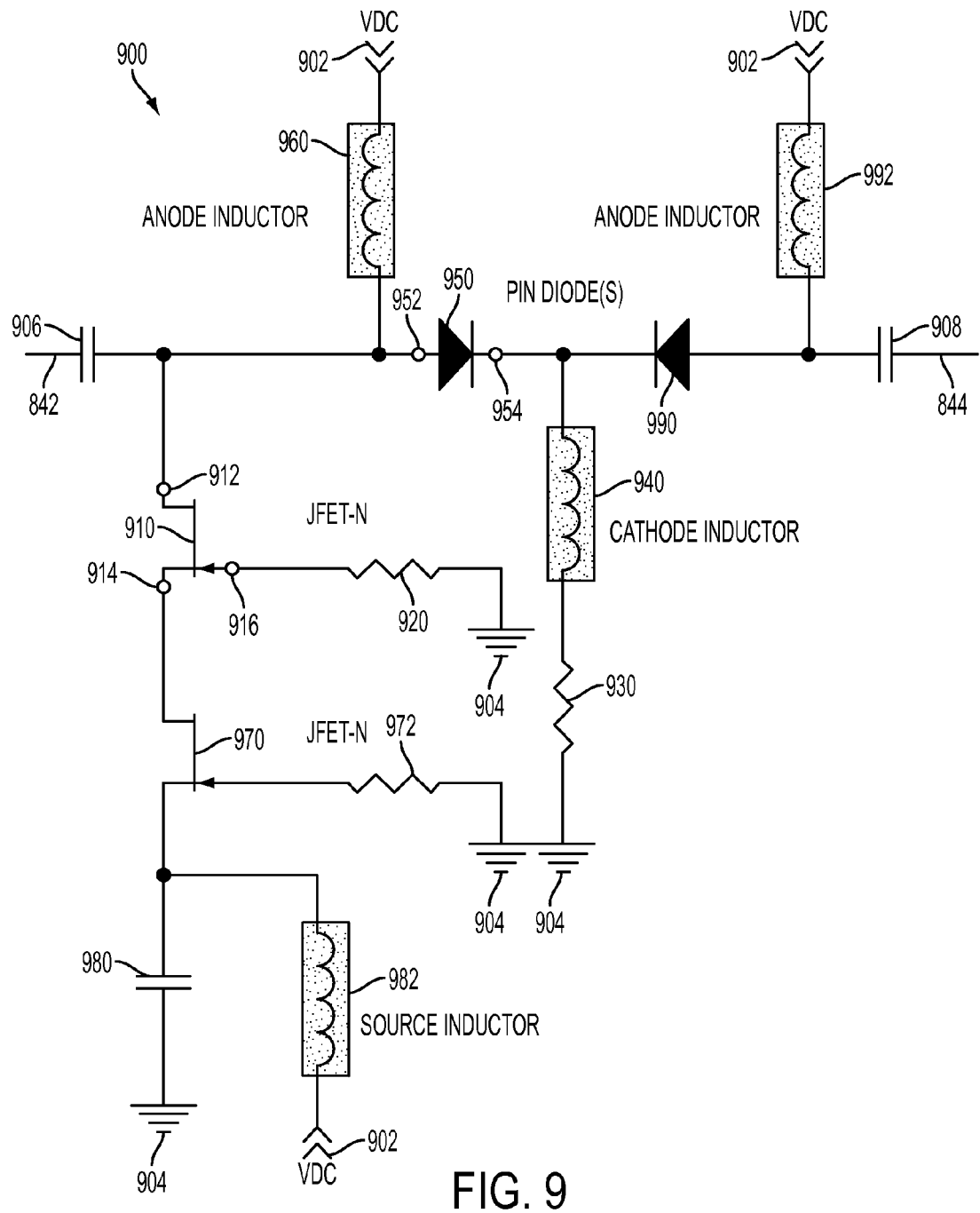
FIG. 9 shows a circuit diagram of a safeguard circuit in accordance with an embodiment.

Referring to FIG. 9, in one embodiment the NID 800 includes safeguard apparatus 900 instead of safeguard apparatus 840. The safeguard apparatus 900 includes a safeguard circuit input 842, which may be operably coupled to a splitter/directional coupler 820 (as shown in FIG. 8), and a safeguard circuit output 844, which may be operably coupled to a downstream/upstream amplifier 850. The safeguard circuit input 842 may be operably coupled to other elements of the safeguard circuit 900 via input capacitor 906 and the safeguard circuit output 844 may be operably coupled to other elements of the safeguard circuit 900 via output capacitor 908.

The JFET 910 has a drain node 912, a source node 914 and a gate node 916 as shown. The drain node 912 is operably coupled to the safeguard circuit input 842, and the gate node 916 is operably coupled to ground 904 via a gate resistor 920. The safeguard circuit 900 also includes a first PIN diode 950. The first PIN diode 950 is shown with an anode 952 and a cathode 954 as shown. The anode 952 is operably coupled to the drain node 912, the anode inductor 960 and the input 842 via capacitor 906. The cathode 954 is operably coupled to the cathode inductor 940 and operably coupled to the safeguard circuit output 844 via a second PIN diode 990. The cathode inductor 940 is also operably coupled to ground 904 via the cathode resister 930.

A second JFET 970 is operably connected to ground 904 via gate resistor 972. The source node 914 of the first JFET is operably coupled to the drain node of the second JFET 970.

As seen above, the safeguard circuit 900 also includes various inductors, such as anode inductor 960, source inductor 982 and anode inductor 992 which are connected to a DC power voltage 902 (sourced by a control signal from a separate operational fault sensing circuit). The source inductor 982 is connected to a source node of the second JFET 970 and to ground 904 via a source capacitor 980.

Figure 10:
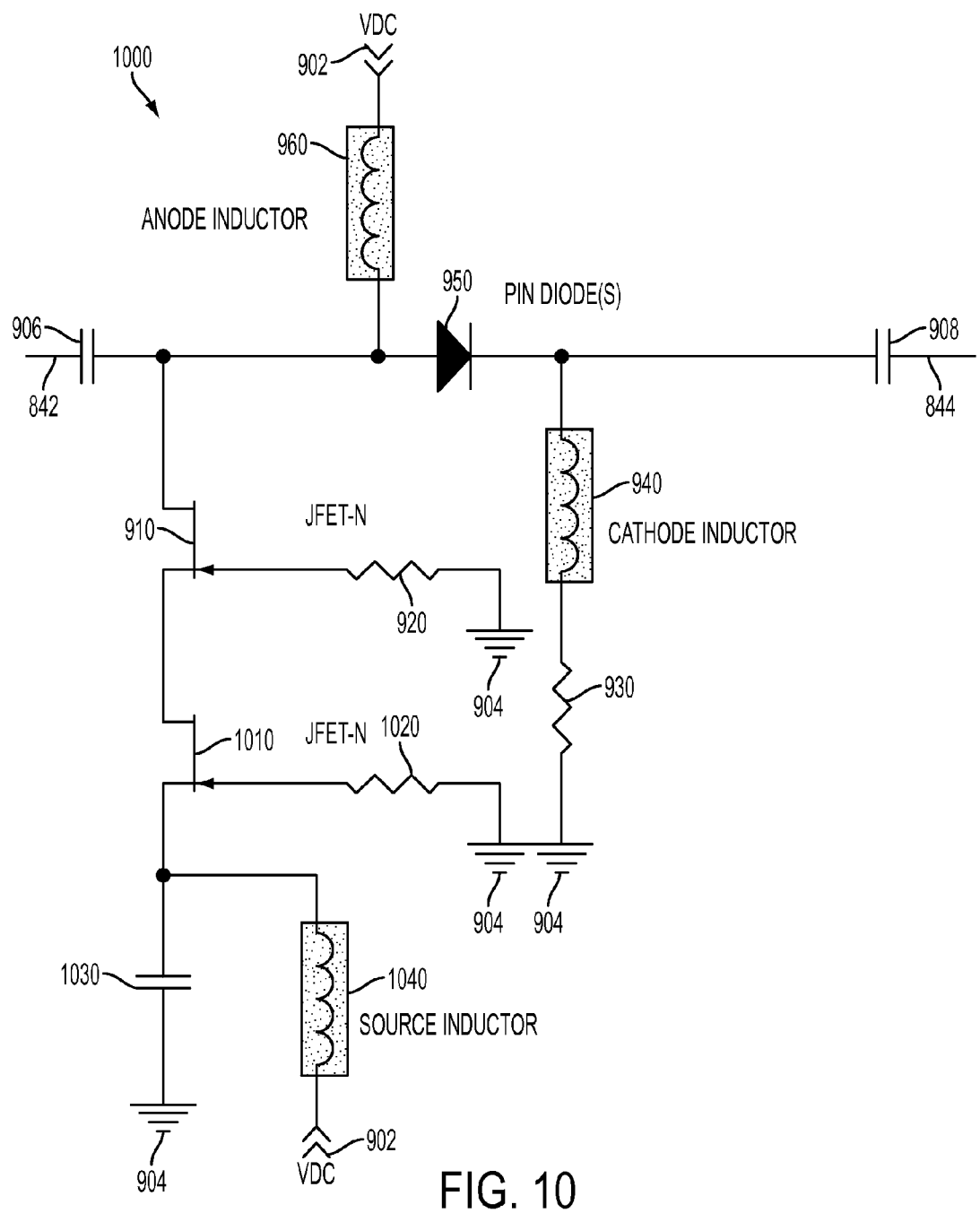
FIG. 10 shows a circuit diagram of another safeguard circuit in accordance with another embodiment.

Referring to FIG. 10, in one embodiment the NID 800 includes safeguard apparatus 1000 instead of safeguard apparatus 840. In this embodiment, a single PIN diode 950 is used. Similar to that shown in FIG. 9, the safeguard apparatus 1000 includes the safeguard circuit input 842, safeguard circuit output 844, DC power (control) voltage 902 and ground 904. An input capacitor 906, output capacitor 908, first JFET 910, gate resistor 920, cathode resistor 930, cathode inductor 940, first PIN diode 950 and anode inductor 960 are also present in a similar matter as in the embodiment of FIG. 9.

A first JFET 910 is located between the second JFET 1010 and safeguard circuit input 842. The second JFET 1010 is operably coupled to ground 904 via gate resistor 1020.

The second JFET 1010 is operably coupled at a source node to a source capacitor 1030 and source inductor 1040.

Figure 11:
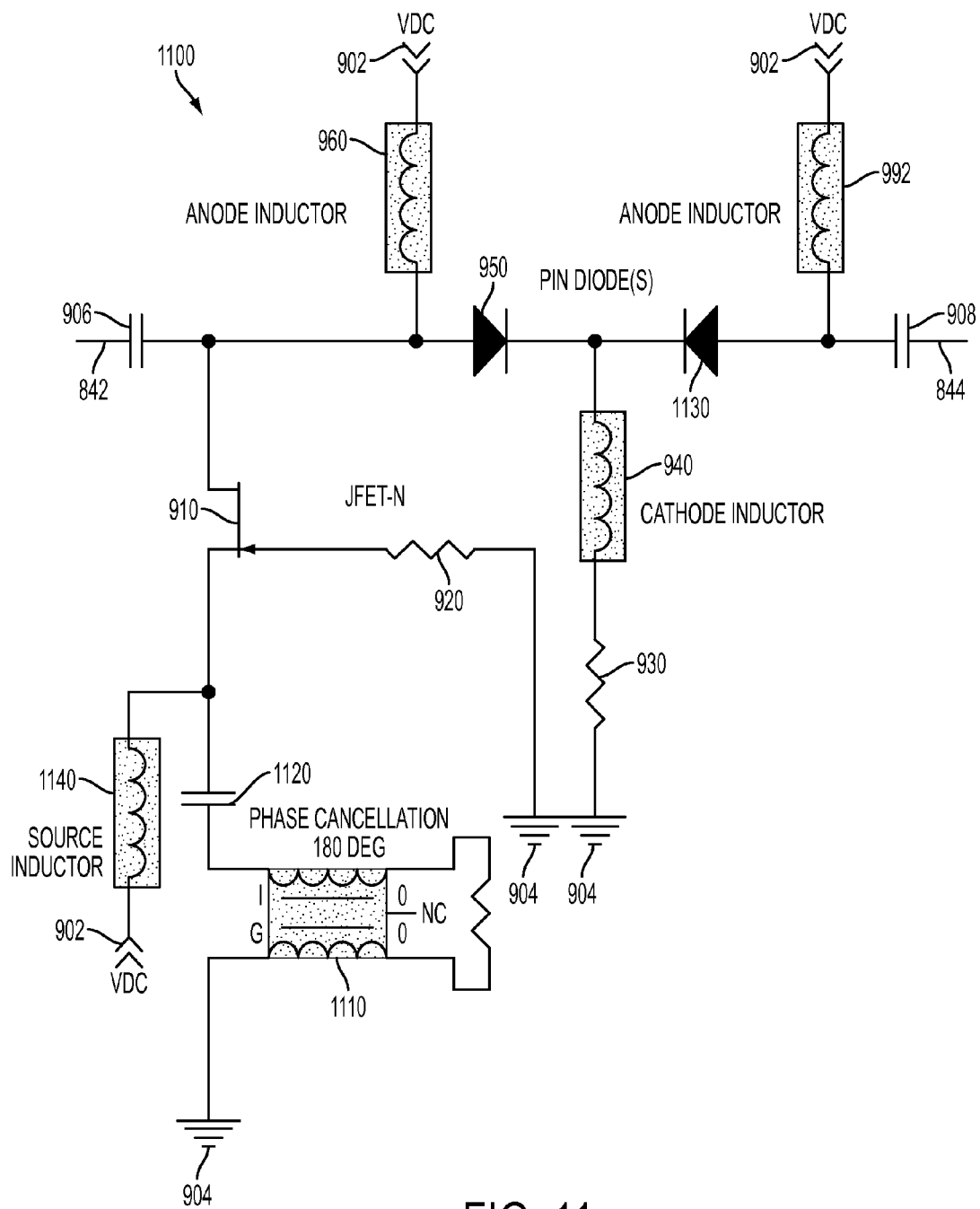
FIG. 11 shows a circuit diagram of a further safeguard circuit in accordance with a further embodiment.

Referring to FIG. 11, in one embodiment the NID 800 includes safeguard apparatus 1100 instead of safeguard apparatus 840. Here, the safeguard circuitry has phase cancellation elements. As shown in FIGS. 8-9, the circuitry includes an input capacitor 906, an output capacitor 908, a first JFET 910, a gate resistor 920, a cathode resistor 930, a cathode inductor 940, a first PIN diode 950 and an anode inductor 960. These elements are operably coupled (in various ways) to the safeguard circuit input 842, the safeguard circuit output 844, a DC power (control) voltage 902 and to ground 904 as shown.

In this embodiment, a balun 1110 is operably coupled to the first JFET 910 (for example, at a source node 914) via decoupling capacitor 1120. The balun 1110 is also operably coupled to ground 904. A source inductor 1140 is connected to the source node of the first JFET 910 and the capacitor 1120 on one end and to DC power (control) voltage 902 on the other end.

Additionally, a second PIN diode 1130 is located between the connection of the first PIN diode 950 and cathode inductor 940 and to the safeguard circuit output 844. An anode inductor 992 is connected to the anode of the second PIN diode 1130.

Figure 12:
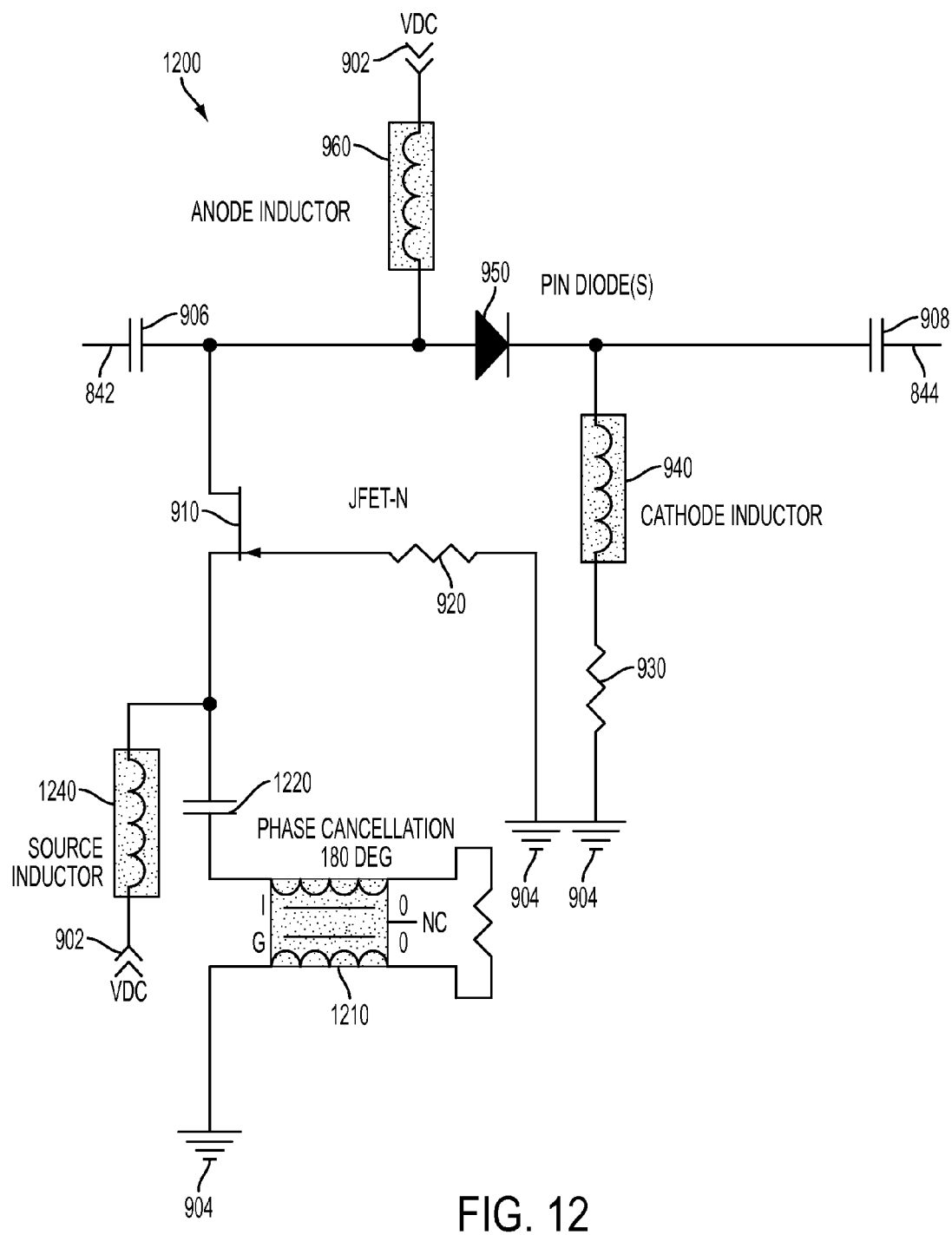
FIG. 12 shows a circuit diagram of an additional safeguard circuit in accordance with an additional embodiment.

Referring to FIG. 12, in one embodiment the NID 800 includes safeguard apparatus 1200 instead of safeguard apparatus 840. Here, the safeguard circuitry has phase cancelation elements using a single PIN diode 950. As shown in FIGS. 8-9, the circuitry includes an input capacitor 906, an output capacitor 908, a first JFET 910, a gate resistor 920, a cathode resistor 930, a cathode inductor 940, a first PIN diode 950 and an anode inductor 960. These elements are operably coupled (in various ways) to the safeguard circuit input 842, the safeguard circuit output 844, a DC power voltage 902 and to ground 904 as shown. A balun 1210 is operably coupled to the first JFET 910 (for example, at a source node 914) via decoupling capacitor 1220. The balun 1210 is also operably coupled to ground. A source inductor 1240 is connected to the first JFET 910 and the capacitor 1220 on one end and to DC power (control) voltage 902 on the other end.

As shown above, each of the safeguard apparatuses 840, 900, 1000, 1100 and 1200 includes diodes (such as PIN diodes) and transistors (such as field-effect transistors (FETs) or, more specifically, JFETs) instead of electromechanical relay switches making the safeguard apparatuses 840, 900, 1000, 1100 and 1200 solid-state configurations (or static configuration). The diodes and transistors are operable to construct a mode selector to control the throughput of data on the active communication path while safeguarding the passive communication path. Such a circuit has higher reliability than electromechanical switches/relays, it provides greater linearity with higher RF power handling capability in a shunt configuration (as shown) than RF metal-oxide-semiconductor field-effect transistors (MOSFETs) and less insertion loss than traditional solid state switch integrated circuits ICs. Additionally, various embodiments enable the safeguarding circuitry to operate in powered-off conditions.

The various electrical elements, such as JFETs 910, 970, 1010 and PIN diode 950, 990, 1130, may be of any type suitable to the local technical environment and may be implemented using any suitable technology, such as properly prepared FETs, etc.

Figure 13:
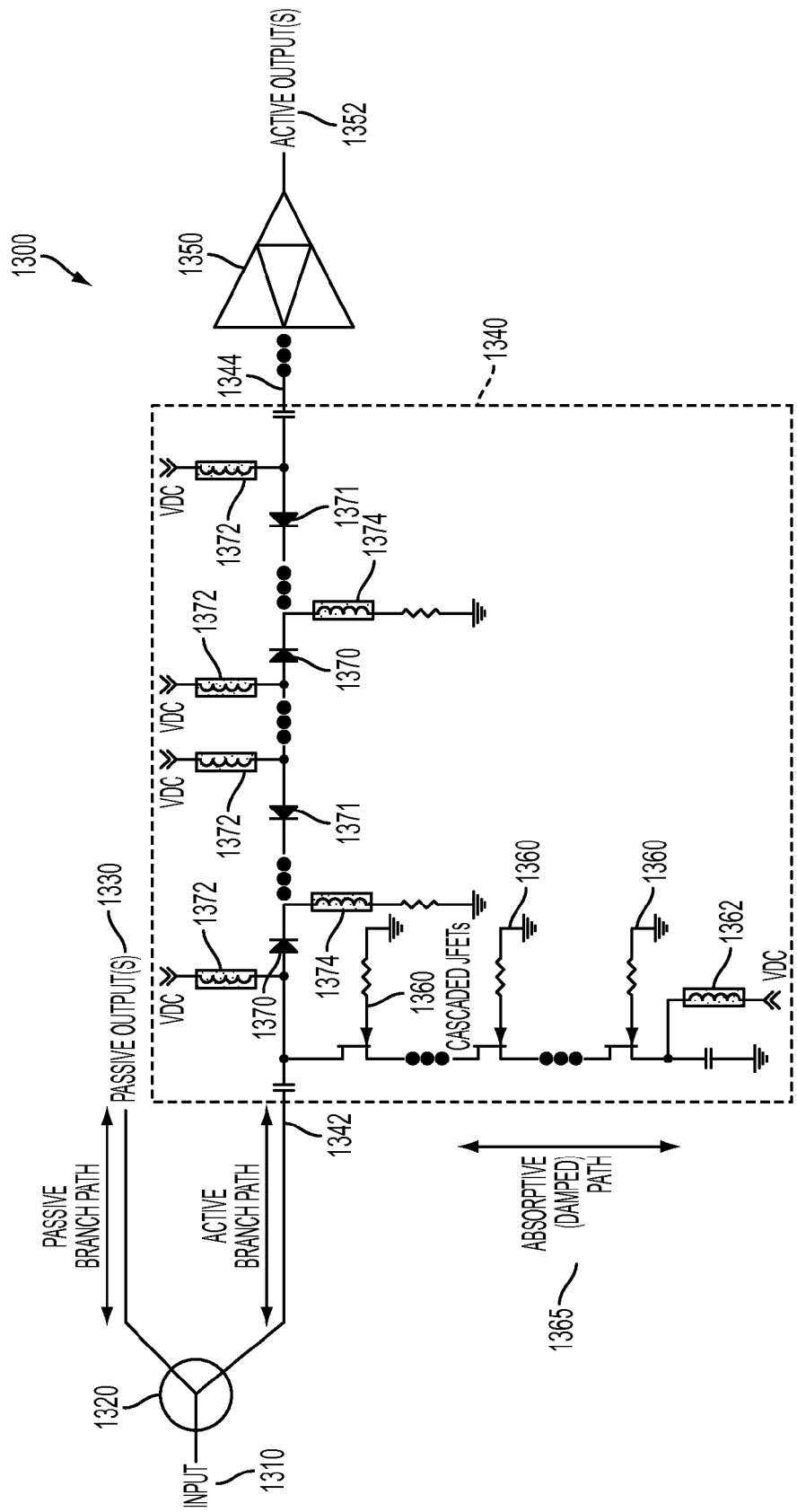
FIG. 13 is a simplified block diagram of a further network interface device in accordance with an embodiment.

Referring to FIG. 13, NID 1300 has an input 1310 operable to receive CATV signals. A splitter/directional coupler 1320 separates the CATV signals into active path communications (or active signals) and passive path communications (or passive signals). The passive path communications (such as critical or essential path communications or emergency telephone signals) are sent to passive device(s) 1330, such as a VoIP telephone.

The active signals are sent through a safeguard apparatus 1340. The safeguard circuit input 1342 receives the active path communications from the splitter/directional coupler 1320 and supplies the active path communications to an active branch conditioner (such as downstream/upstream amplifier 1350) at safeguard circuit output 1344. Active output(s) 1352 may then be supplied to active devices (for example, via a second splitter).

The safeguard apparatus 1340 includes cascaded JFET circuits 1360 and source inductor circuit 1362 establishing an absorptive (damped) path 1365. The cascaded JFET circuits 1360 include one or more JFET circuit 1360 having a JFET, gate resistor and ground. The source inductor circuit 1362 includes a source inductor operably coupled to a DC power (control) voltage and includes a capacitor operably coupled to ground.

The safeguard apparatus 1340 also includes cascaded PIN diode circuits 1370, 1371. As shown, the safeguard apparatus 1340 has multiple first oriented cascaded PIN diode circuits 1370 (for example, those having an anode operably connected to the safeguard circuit input 1342 and a cathode operably connected to the safeguard circuit output 1344) and multiple second oriented cascaded PIN diode circuits 1371 (for example, those having a cathode operably connected to the safeguard circuit input 1342 and an anode operably connected to the safeguard circuit output 1344). Also shown, are multiple anode inductors 1372 connected to the anodes of various cascaded PIN diode circuits 1370, 1371 and multiple cathode inductor 1374 connected to the cathodes of various cascaded PIN diode circuits 1370, 1371. In additional embodiments, the safeguard circuit may include a single PIN diode circuit 1370, 1371 and one anode/cathode inductor 1372, 1374.

An embodiment is a NID operable to couple two or more subscriber devices to a CATV network. Downstream signals are transmittable to the two or more subscriber devices and upstream signals are transmittable from the two or more subscriber devices. The two or more subscriber devices include one or more passive subscriber devices and one or more active subscriber devices. The NID includes a signal splitter configured to separate CATV signals into passive branch signals and into active branch signals. The NID also includes an active branch circuit and a passive branch circuit. The active branch circuit includes an active signal conditioner operable to modify the active branch signals sent through the active branch circuit to the one or more active subscriber device. The passive branch signals are sendable through the passive branch circuit to the one or more passive subscriber device. The NID includes a safeguard circuit operably coupled to the active branch circuit and the signal splitter (either directly connected or via intervening elements). The safeguard circuit has a first mode and a second mode. The safeguard circuit is configured to exchange the CATV signals between the CATV network and the one or more active subscriber device when in the first mode and the safeguard circuit is configured to perform signal reduction when in the second mode. The safeguard circuit is configured to assume the first mode in response to sensing a normal operative condition of the NID and to assume the second mode in response to sensing an abnormal operative condition of the NID.

In a further embodiment of the NID above, the safeguard circuit includes a phase cancellation element. The phase cancellation circuit is adapted to convert the CATV signals into a phase-delayed signal, the phase-delayed signal being out of phase with respect to a reference signal. The phase cancellation element may be a balun transformer, such as a 180-degree 1:1 balun transformer for example.

In an additional embodiment of any of the NID above, the safeguard circuit is a solid-state configuration (or static configuration). A solid-state configuration is a circuit design which does not include moving parts (such as electromechanical switches).

In another embodiment of any of the NID above, the safeguard circuit includes one or more JFETs, one or more PIN diodes and one or more inductors.

A further embodiment is a safeguard circuit (or apparatus) includable within a NID. The safeguard circuit includes an input node (such as to receive active branch signals from a splitter) and an output node (such as to supply active branch signals to an active signal conditioner). The safeguard circuit also includes a first JFET having a drain node, a source node and a gate node; and a first PIN diode having a first PIN diode anode and a first PIN diode cathode. The drain node of the first JFET is operably coupled to the first PIN diode anode and to the input node. The gate node of the first JFET is operably coupled to ground. The first PIN diode cathode is operably coupled to the output node.

In another embodiment of the safeguard circuit above, the safeguard circuit also includes an anode inductor having a first anode inductor end and a second anode inductor end, wherein: (a) the first anode inductor end is operably coupled to a voltage source and (b) the second anode inductor end is operably coupled to the first PIN diode anode.

In a further embodiment of any one of the safeguard circuits above, the safeguard circuit also includes a gate resistor having a first gate resistor end and a second gate resistor end; an cathode resistor having a first cathode resistor end and a second cathode resistor end; and a cathode inductor having a first cathode inductor end and a second cathode inductor end.

In another embodiment of any one of the safeguard circuits above, the gate node of the first JFET is operably coupled to the first gate resistor end. The second gate resistor end is operably coupled to ground. The first cathode resistor end is operably coupled to ground and the second cathode resistor end is operably coupled to the first cathode inductor end. The second cathode inductor end is operably coupled to the first PIN diode cathode and operably coupled to the output node.

In a further embodiment of any one of the safeguard circuits above, the safeguard circuit also includes a second PIN diode having a second PIN diode anode and a second PIN diode cathode. The first PIN diode cathode is operably coupled to the output node via the second PIN diode. The second PIN diode anode is operably coupled to the output node and the second PIN diode cathode is operably coupled to the first PIN diode cathode. The safeguard circuit may also include an anode inductor having a first anode inductor end and a second anode inductor end. The first anode inductor end is operably coupled to a voltage source and the second anode inductor end is operably coupled to the second PIN diode anode.

In another embodiment of any one of the safeguard circuits above, the safeguard circuit also includes a phase cancellation element having a first phase cancellation element end and a second phase cancellation element end. The first phase cancellation element end is operably coupled to the source node of the first JFET and the second phase cancellation element end is operably coupled to ground. The phase cancellation element may include a balun transformer, such as a 180-degree 1:1 balun transformer for example.

In an additional embodiment of any of the safeguard circuits above, the safeguard circuit is a solid-state configuration (or static configuration). A solid-state configuration is a circuit design which does not include moving parts (such as electromechanical switches).

In a further embodiment of any one of the safeguard circuits above, the safeguard circuit also includes a second JFET having a second JFET drain node, a second JFET source node and a second JFET gate node. The drain node of the second JFET is operably coupled to the first PIN diode anode and to the input node via first JFET and the drain node of the second JFET is operably coupled to the first JFET source node. The safeguard circuit may also include a gate resistor having a first resistor end and a second resistor end. The first resistor end is operably coupled to the second JFET gate node and the second gate resistor end is operably coupled to ground.

In another embodiment of any one of the safeguard circuits above, the safeguard circuit also includes a source inductor having a first source inductor end and a second source inductor end. The first source inductor end is operably coupled to the source node of the second JFET, and the second source inductor end is operably coupled to a voltage source. The voltage source may be a control voltage provided by a fault sensing circuit.

A further embodiment is a safeguard circuit includable within a NID. The safeguard circuit includes an input node and an output node. The safeguard circuit also includes an anode inductor; a first JFET; a gate resistor; an inductor resistor; a cathode inductor; and a first PIN diode. The drain node of the first JFET is operably coupled to the first PIN diode anode, to the input node and to the second anode inductor end. The first anode inductor end is operably coupled to a voltage source. The gate node of the first JFET is operably coupled to the first gate resistor end and the second gate resistor end is operably coupled to a first ground point. The first cathode resistor end is operably coupled to a second ground point (which may be the same physical connection as the first ground point or may be a separate connection to a common ground line). The second cathode resistor end is operably coupled to the first cathode inductor end. The second cathode inductor end is operably coupled to the first PIN diode cathode and operably coupled to the output node.

In another embodiment of the safeguard circuit above, the safeguard circuit also includes a second JFET; a gate resistor; and a source inductor. The drain node of the second JFET is operably coupled to the first PIN diode anode and to the input node via first JFET and the drain node of the second JFET is operably coupled to the first JFET source node. The first JFET drain node is operably coupled to the first PIN diode anode, to the input node and to the second anode inductor end. The first gate resistor end is operably coupled to the first JFET gate node and the second gate resistor end is operably coupled to a third ground point. The first source inductor end is operably coupled to the source node of the second JFET and the second source inductor end is operably coupled to a second voltage source. The safeguard circuit may also include a second PIN diode, where the second cathode inductor end and the first PIN diode cathode are operably coupled to the output node via the second PIN diode, the second PIN diode anode is operably coupled to the output node, and the second PIN diode cathode is operably coupled to first PIN diode cathode and to the second cathode inductor end. The safeguard circuit may also include an anode inductor, where the first anode inductor end is operably coupled to a third voltage source and the second anode inductor end is operably coupled to the second PIN diode anode.

In a further embodiment of the safeguard circuit above, the safeguard circuit also includes a phase cancellation element. The first phase cancellation element end is operably coupled to the source node of the first JFET (such as via a second JFET) and the second phase cancellation element end is operably coupled to a second ground point. The safeguard circuit may also include a second PIN diode, where the second cathode inductor end and the first PIN diode cathode are operably coupled to the output node via the second PIN diode, the second PIN diode anode is operably coupled to the output node, and the second PIN diode cathode is operably coupled to first PIN diode cathode and to the second cathode inductor end. The safeguard circuit may also include another anode inductor, where the first output anode end is operably coupled to a second voltage source (which may be the same voltage source as the first voltage source) and the second anode inductor end is operably coupled to the second PIN diode anode.

In an additional embodiment of any of the safeguard circuits above, the safeguard circuit is a solid-state configuration.

While the embodiments have been described with reference to a number of specific embodiments, it will be understood that the true spirit and scope of the invention should be determined only with respect to claims that can be supported by the present specification. Further, while in numerous cases herein wherein systems and apparatuses and methods are described as having a certain number of elements it will be understood that such systems, apparatuses and methods can be practiced with fewer than the mentioned certain number of elements. Also, while a number of particular embodiments have been described, it will be understood that features and aspects that have been described with reference to each particular embodiment can be used with each remaining particularly described embodiment.

Additional embodiments include any one of the embodiments described above, where one or more of its components, functionalities or structures is interchanged with, replaced by or augmented by one or more of the components, functionalities or structures of a different embodiment described above.

It should be understood that various changes and modifications to the embodiments described herein will be apparent to those skilled in the art. Such changes and modifications can be made without departing from the spirit and scope of the disclosed embodiments and without diminishing their intended advantages. It is therefore intended that such changes and modifications be covered by the appended claims.

It should be understood that the disclosure is not limited to the specific embodiments disclosed herein above, and that many modifications and other embodiments are intended to be included within the scope of the appended claims. Moreover, although specific terms are employed herein, as well as in the claims which follow, they are used only in a generic and descriptive sense, and not for the purposes of limiting the disclosure, nor the claims which follow.

The following is claimed:

1. A safeguard apparatus operable in a network interface device, the safeguard apparatus comprising:
    an input node;
    a first field-effect transistor (FET) having a drain node, a source node and a gate node;
    a first PIN diode having a first PIN diode anode and a first PIN diode cathode;
    an output node;
    wherein the drain node of the first FET is coupled to the first PIN diode anode and to the input node, the gate node of the first FET is connected to a ground, the first PIN diode cathode is connected to the output node, and the safeguard apparatus is configured to pass signals from the input node and the first FET through the first PIN diode before reaching the output node;
    wherein the first FET is configured to be reverse biased so as to allow a CATV network and a subscriber device to communicate through the first FET, the input node, and the output node when the network interface device is in a first mode of operation;
    wherein the first FET is configured to be forward biased so as to provide a dampened signal path to a ground path for a CATV signal received through the input node or the output node when the network interface device is in a second mode of operation; and
    wherein the first FET is configured to dampen the CATV signal received through the input node or the output node to prevent disruptive reflections from returning through the dampened signal path.

2. The safeguard apparatus of claim 1, further comprising an anode inductor having a first anode inductor end and a second anode inductor end, wherein: (a) the first anode inductor end is coupled to a voltage source and (b) the second anode inductor end is coupled to the first PIN diode anode.

3. The safeguard apparatus of claim 1, further comprising a gate resistor having a first gate resistor end and a second gate resistor end, wherein the gate node of the first FET is coupled to the first gate resistor end, and the second gate resistor end is coupled to the ground path.

4. The safeguard apparatus of claim 1, further comprising:
    a cathode resistor having a first cathode resistor end and a second cathode resistor end; and
    a cathode inductor having a first cathode inductor end and a second cathode inductor end,
    wherein the first cathode resistor end is coupled to the ground, the second cathode resistor end is coupled to the first cathode inductor end, and
    the second cathode inductor end is coupled to the first PIN diode cathode and operably coupled to the output node.

5. The safeguard apparatus of claim 1, further comprising a second PIN diode having a second PIN diode anode and a second PIN diode cathode,
    wherein the first PIN diode cathode is coupled to the output node via the second PIN diode,
    the second PIN diode anode is coupled to the output node, and the second PIN diode cathode is coupled to the first PIN diode cathode, wherein the first FET is configured to be reverse biased so as to isolate a throughput communication path from a ground path and allow unimpeded communication between the input node to the output node in a first mode of operation and configured to be forward biased to provide a dampened signal path to the ground path in a second mode of operation.

6. The safeguard apparatus of claim 5, further comprising a second anode inductor having a first end and a second end, wherein: (a) the first end of the second anode inductor is coupled to a voltage source and (b) the second end of the second anode inductor is coupled to the second PIN diode anode.

7. The safeguard apparatus of claim 1, further comprising a phase cancellation element having a first phase cancellation element end and a second phase cancellation element end, wherein: (a) the first phase cancellation element end is coupled to the source node of the first FET and (b) the second phase cancellation element end is coupled to the ground.

8. The safeguard apparatus of claim 7, wherein the phase cancellation element comprises a balun transformer.

9. The safeguard apparatus of claim 1, wherein the safeguard apparatus comprises a solid-state configuration.

10. The safeguard apparatus of claim 1, further comprising a second FET having a second FET drain node, a second FET source node and a second FET gate node, wherein: (a) the second FET drain node is coupled to the source node of the first FET, and (b) the second FET drain node is coupled to the first PIN diode anode and to the input node via the first FET.

11. The safeguard apparatus of claim 10, further comprising a gate resistor having a first gate resistor end and a second gate resistor end, wherein: (a) the first gate resistor end is coupled to the second FET gate node and (b) the second gate resistor end is coupled to the ground.

12. The safeguard apparatus of claim 1, further comprising a source inductor having a first source inductor end and a second source inductor end, wherein: (a) the first source inductor end is coupled to the source node of the first FET and coupled to the ground, and (b) the second source inductor end is coupled to a voltage source.

13. The safeguard apparatus of claim 12, where the voltage source is a control voltage provided by a fault sensing circuit.

14. The safeguard apparatus of claim 1, further comprising:
an input capacitor directly coupled to the input node, the drain node of the first FET, and the first PIN diode anode;
an anode inductor directly coupled to the input capacitor, the drain node of the first FET, and the first PIN diode anode, wherein the anode inductor is configured to receive power from a DC voltage source;
a gate resistor directly coupled to the gate node of the first FET;
a cathode inductor directly coupled to the first pin diode cathode;
a cathode resistor directly coupled to the cathode inductor; and
an output capacitor directly coupled to the output node.

15. The safeguard apparatus of claim 1, wherein the gate node of the first FET is connected to a ground such that signals pass through the gate node to the ground.

16. The safeguard apparatus of claim 1, wherein the first PIN diode cathode is connected to the output node such that signals pass through the first PIN diode cathode to the output node.

17. The safeguard apparatus of claim 1, further comprising a damping circuit comprising the first FET, wherein the damping circuit is configured to dampen the CATV signal received via the input node or the output node to prevent disruptive reflections from returning through the dampened signal path.

18. The safeguard apparatus of claim 17, wherein the damping circuit is configured to dampen the CATV signal without electromagnetic switching.

19. The safeguard apparatus of claim 17, wherein the damping circuit comprises a solid-state configuration that has no moving or electromechanical switches.

20. The safeguard apparatus of claim 1, wherein the first FET is configured to dampen the CATV signal by reducing an amplitude of oscillation of the CATV signal.

21. A safeguard apparatus operable in a network interface device, the safeguard apparatus comprising:
an input node;
an anode inductor having a first anode inductor end and a second anode inductor end;
a first field-effect transistor (FET) having a drain node, a source node and a gate node;
a gate resistor having a first gate resistor end and a second gate resistor end;
a cathode inductor having a first cathode inductor end and a second cathode inductor end;
an cathode resistor having a first cathode resistor end and a second cathode resistor end;
a first PIN diode having a first PIN diode anode and a first PIN diode cathode;
an output node;
wherein:
the drain node of the first FET is connected to the first PIN diode anode, to the input node and to the second anode inductor end;
the first anode inductor end is connected to a voltage source;
the gate node of the first FET is connected to the first gate resistor end;
the second gate resistor end is connected to a ground;
the first cathode resistor end is connected to the ground;
the second cathode resistor end is connected to the first cathode inductor end;
the second cathode inductor end is connected to the first PIN diode cathode and connected to the output node; and
the safeguard apparatus is configured to pass signals from the input node and the first FET through the first PIN diode before reaching the output node;
wherein the first FET is configured to be reverse biased as to allow communication between a CATV network and a subscriber device via the first FET, the input node, and the output node when the network interface device is in a first mode of operation, and wherein the first FET is configured to be forward biased to provide a dampened signal path to the ground path for a CATV signal received via the input node or the output node when the network interface device is in a second mode of operation; and
wherein the first FET is configured to dampen the CATV signal received via the input node or the output node to prevent disruptive reflections from returning through the dampened signal path.

22. The safeguard apparatus of claim 21, further comprising:
- a second FET having a second FET drain node, a second FET source node and a second FET gate node,
- a second FET gate resistor having a plurality of ends; and
- a source inductor having a first source inductor end and a second source inductor end,
- wherein the second FET drain node is coupled to the first PIN diode anode and to the input node via the first FET,
- the second FET drain node is coupled to the source node of the first FET,
- an end of the second FET gate resistor is coupled to the second FET gate node,
- another end of the second FET gate resistor is coupled to the ground,
- the first source inductor end is coupled to the source node of the first FET and to the ground, and
- the second source inductor end is coupled to the voltage source.

23. The safeguard apparatus of claim 22, further comprising:
- a second PIN diode having a second PIN diode anode and a second PIN diode cathode, wherein: (a) the second cathode inductor end and the first PIN diode cathode are coupled to the output node via the second PIN diode, (b) the second PIN diode anode is coupled to the output node, and (c) the second PIN diode cathode is coupled to first PIN diode cathode and to the second cathode inductor end; and
- a second anode inductor having a first end and a second end, wherein the first end of the second anode inductor is coupled to the voltage source and the second end of the second anode inductor is coupled to the second PIN diode anode.

24. The safeguard apparatus of claim 21, further comprising a phase cancellation element having a first phase cancellation element end and a second phase cancellation element end, wherein: (a) the first phase cancellation element end is coupled to the source node of the first FET, and (b) the second phase cancellation element end is coupled to the ground.

25. The safeguard apparatus of claim 24, further comprising:
- a second PIN diode having a second PIN diode anode and a second PIN diode cathode, wherein: (a) the second cathode inductor end and the first PIN diode cathode are coupled to the output node via the second PIN diode, (b) the second PIN diode anode is coupled to the output node, and (c) the second PIN diode cathode is coupled to first PIN diode cathode and to the second cathode inductor end; and
- a second anode inductor having a first end and a second end, wherein the first end of the second anode inductor is coupled to the voltage source and the second end of the second anode inductor is coupled to the second PIN diode anode.

26. The safeguard apparatus of claim 21, further comprising:
- an input capacitor directly coupled to the input node, the drain node of the first FET, and the first PIN diode anode;
- an output capacitor directly coupled to the output node;
- a gate resistor directly coupled to the gate node of the first FET;
- a cathode inductor directly coupled to the first pin diode cathode;
- a cathode resistor directly coupled to the cathode inductor;
- wherein the anode inductor is directly coupled to the input capacitor, the drain node of the first FET, and the first PIN diode anode; and
- wherein the anode inductor is configured to receive power from a DC voltage source.

27. A safeguard apparatus operable in a network interface device ("NID") that connects at least two subscriber devices to a cable television ("CATV"), the safeguard apparatus comprising:
- an input node configured to receive active path communications from a splitter or directional coupler of the NID and coupled to an active branch circuit of the NID;
- a first field-effect transistor (FET) having a drain node, a source node and a gate node;
- a first PIN diode having a first PIN diode anode and a first PIN diode cathode;
- an output node configured to provide active path communication to an active branch conditioner of the NID;
- wherein: the drain node of the first FET is directly connected to the first PIN diode anode and to the input node, the gate node of the first FET is directly connected to a ground, the first PIN diode cathode is directly connected to the output node, and the safeguard apparatus is configured to pass signals from the input node and the first FET through the first PIN diode before reaching the output node; and
- wherein the first FET is configured to be reverse biased so as to allow a CATV network and a subscriber device to communicate through the first FET, the input node, and the output node when the network interface device is in an active mode of operation, wherein the first FET is configured to be forward biased to provide a dampened signal path to the ground path for a CATV signal received via the input node or the output node when the network interface device is in an inactive mode of operation, and wherein the first FET is configured to absorb the CATV signal received via the input node or the output node to prevent disruptive reflections from returning through the dampened signal path when the network interface device is in the inactive mode.

28. The safeguard apparatus of claim 27, further comprising an anode inductor having a first anode inductor end and a second anode inductor end, wherein: (a) the first anode inductor end is coupled to a voltage source and (b) the second anode inductor end is coupled to the first PIN diode anode.

29. The safeguard apparatus of claim 27, further comprising a gate resistor having a first gate resistor end and a second gate resistor end, wherein the gate node of the first FET is coupled to the first gate resistor end, and the second gate resistor end is coupled to the ground.

30. The safeguard apparatus of claim 27, further comprising:
- a cathode resistor having a first cathode resistor end and a second cathode resistor end; and
- a cathode inductor having a first cathode inductor end and a second cathode inductor end,
- wherein the first cathode resistor end is coupled to the ground, the second cathode resistor end is coupled to the first cathode inductor end, and
- the second cathode inductor end is coupled to the first PIN diode cathode and coupled to the output node.

31. The safeguard apparatus of claim 27, further comprising a second PIN diode having a second PIN diode anode and a second PIN diode cathode;

wherein the first PIN diode cathode is coupled to the output node via the second PIN diode;

the second PIN diode anode is coupled to the output node, and the second PIN diode cathode is coupled to the first PIN diode cathode; and wherein the first PIN diode and the second PIN diode are configured to be forward biased in an on state so as to allow unimpeded throughput communication between the input node to the output node in a first mode of operation and configured to be reverse biased in an off state to isolate the communication path between input and output in a second mode of operation.

32. The safeguard apparatus of claim 27, further comprising:

an input capacitor directly coupled to the input node, the drain node of the first FET, and the first PIN diode anode;

an anode inductor directly coupled to the input capacitor, the drain node of the first FET, and the first PIN diode anode, wherein the anode inductor is configured to receive power from a DC voltage source;

a gate resistor directly coupled to the gate node of the first FET;

a cathode inductor directly coupled to the first pin diode cathode;

a cathode resistor directly coupled to the cathode inductor; and an output capacitor directly coupled to the output node.

33. A safeguard apparatus operable in a network interface device, the safeguard apparatus comprising:

an input node;

an output node; and a transistor coupled to the input and output nodes;

wherein, when the transistor in a throughput state, the safeguard apparatus allows communication between the input node and the output node such that a CATV signal is exchanged between a CATV network and a subscriber device;

wherein, when the transistor is in an absorptive state, the safeguard apparatus is configured to provide a dampened signal path to ground, resulting in signal reduction that prevents signal reflections back to the input node;

wherein the transistor in the absorptive state is configured to absorb the CATV signal received via the input node or the output node to reduce or prevent disruptive reflections from returning through the dampened signal path;

wherein the transistor is configured to be in the throughput state when the network interface device is operating in a normal condition; and wherein the transistor is configured to be in the absorptive state when the network interface is operating in an abnormal condition.

34. The safeguard apparatus of claim 33, wherein the input node is configured to receive active path communications from a splitter or directional coupler of the network interface device and coupled to an active branch circuit of the network interface device and the output node is configured to provide active path communication to an active branch conditioner of the network interface device.

35. The safeguard apparatus of claim 34, wherein the transistor is connected to the active branch circuit, and has a first drain node, a first source node, and a first gate node, and wherein the first drain node is coupled to the input node and the first gate node is coupled to a common ground via a first gate resistor.

36. The safeguard apparatus of claim 35, wherein the transistor comprises a first transistor, the safeguard apparatus further comprising:

a first PIN diode having a first PIN diode anode and a first PIN diode cathode, wherein the first PIN diode anode is coupled to the first drain node, an anode inductor, and the input node via a first capacitor and the first diode cathode is coupled to a cathode inductor and coupled to output node via a second PIN diode, wherein the cathode inductor is coupled to the common ground via a cathode resistor; and a second transistor having a second drain node, a second source node, and a second gate node, wherein the second transistor is coupled to the common ground via a second gate resistor and the second drain node is coupled to the first source node.

37. The safeguard apparatus of claim 33, further comprising:

an input capacitor directly coupled to the input node and the transistor;

a diode directly coupled to the input capacitor and the transistor;

an anode inductor directly coupled to the input capacitor, the transistor, and the diode, wherein the anode inductor is configured to receive power from a DC voltage source;

a gate resistor directly coupled to the transistor;

a cathode inductor directly coupled to the diode;

a cathode resistor directly coupled to the cathode inductor; and an output capacitor directly coupled to the output node.

38. A network interface device for passively maintaining data communications quality when the network interface device is operating in a disruptive operating condition state comprising:

a disruptive signal reflection dampener configured to selectively control communication in the network interface device by changing between a throughput state and an absorptive state;

wherein, in the throughput state, a CATV signal is exchanged between a CATV network and a subscriber device through the network interface device;

wherein, in the absorptive state, the CATV signal is not exchanged between the CATV network and the subscriber device through the network interface device, and a dampened signal path to a ground is provided so as to passively prevent a signal reflection between the CATV network and the subscriber device from disrupting passive operation quality of the network interface device;

wherein the disruptive signal reflection dampener is configured to change from the throughput state to the absorptive state in response to the network interface device transitioning from a non-disruptive operating condition state to the disruptive operating condition state, and to dampen the CATV signal exchanged between the CATV network and the subscriber so as to passively prevent a disruptive signal reflection from returning through the dampened signal path when the network interface device is operating in the disruptive operating condition state; and wherein the disruptive signal reflection dampener comprises a solid-state configuration arranged to dampen the CATV signal by reducing an amplitude of oscillation of the CATV signal.

39. The network interface device of claim 38, further comprising an active circuit branch comprising one or more powered components, the active circuit branch being configured to receive signals from the disruptive signal reflection dampener in the throughput state, wherein the network interface device is in the disruptive operating condition when the one or more powered components are inoperative or not powered.

40. The network interface device of claim 38, further comprising:
    a splitter or a directional coupler;
    a signal conditioner;
    an input node configured to receive active path communications from the splitter or directional coupler; and
    an output node configured to provide active path communications to the signal conditioner when the disruptive signal reflection dampener is in the throughput state.

41. The network interface device of claim 40, further comprising:
    an active circuit branch comprising one or more powered components and being coupled to the disruptive signal reflection dampener, the active circuit branch being configured to receive downstream signals therefrom when the disruptive signal reflection dampener is in the throughput state, wherein the disruptive signal reflection dampener is coupled to the splitter or directional coupler and configured to receive downstream signals therefrom and provide upstream signals thereto; and
    a passive circuit branch coupled to the splitter or directional coupler and configured to receive downstream signals therefrom and provide upstream signals thereto, wherein the passive circuit branch is configured to be coupled to a passive port, and wherein the passive circuit does not include any powered components.

42. The network interface device of claim 38, wherein the disruptive signal reflection dampener comprises a transistor.

43. The network interface device of claim 42, wherein the transistor has a drain node coupled to an input node, and a gate node coupled to a common ground through a gate resistor.

44. The network interface device of claim 43, further comprising a diode having an anode coupled to the drain node, an anode inductor, and the input node through a capacitor, and a cathode coupled to an inductor and an output node through a second diode, and wherein the inductor is coupled to the common ground through a cathode resistor.

45. The network interface device of claim 43, wherein the transistor comprises a first transistor, the drain node comprises a first drain node, the gate node comprises a first gate node, the gate resistor comprises a first gate resistor, and further comprising a second transistor having a second drain node, and a second gate node, and wherein the second transistor is coupled to the common ground through a second gate resistor.

46. The network interface device of claim 38, wherein the disruptive signal reflection dampener includes a gate node that is connected to the ground such that signals pass through the gate node to the ground.

47. The network interface device of claim 38, wherein the disruptive signal reflection dampener includes a diode cathode that is connected to an output node such that signals pass through the diode cathode to the output node.

48. The network interface device of claim 38, wherein the disruptive signal reflection dampener is configured to dampen the CATV signal without electromechanical switching.

49. The network interface device of claim 38, wherein the solid-state configuration of the disruptive signal reflection dampener is arranged to transition from the non-disruptive operating condition state to the disruptive operating condition state and dampen the CATV signal without an electromechanical switch.

50. The network interface device of claim 38, wherein the solid-state configuration of the disruptive signal reflection dampener is arranged to transition from the non-disruptive operating condition state to the disruptive operating condition state and dampen the CATV signal without a moving switch.

51. A network interface device for passively maintaining data communications quality when the network interface device is operating in a disruptive operating condition state comprising:
    an active circuit branch configured to be coupled to an active subscriber device, the active circuit branch comprising one or more powered components; and
    a disruptive reflection dampener configured to selectively control communication to the active branch by transitioning between a throughput state and an absorptive state;
    wherein, when the disruptive reflection dampener is in the throughput state, a CATV signal is exchanged between a CATV network and the subscriber device through the active circuit branch;
    wherein, when the disruptive dampener is in the absorptive state, the CATV signal is prevented from passing between the CATV network and the subscriber device through the active circuit branch, and a dampened signal path to a ground is provided so as to passively prevent a signal reflection between the CATV network and the subscriber device from disrupting passive operation quality of the network interface device; and
    wherein the disruptive reflection dampener is configured to transition from the throughput state to the absorptive state in response to the network interface device changing from a non-disruptive operating condition state to a disruptive operating condition state, and wherein the network interface device changes from the non-disruptive operating condition state to the disruptive operating condition state in response to at least one of the one or more powered components being inoperative or not powered.

52. The network interface device of claim 51, further comprising:
    a splitter or directional coupler;
    an input node configured to receive active path communications from the splitter or directional coupler; and
    an output node configured to provide active path communications to the one or more powered components of the active branch circuit, the one or more powered components comprising a signal conditioner.

53. The network interface device of claim 51, wherein the disruptive reflection dampener comprises a transistor.

54. The network interface device of claim 53, wherein the transistor has a drain node coupled to an input node, and a gate node coupled to a common ground through a gate resistor.

55. The network interface device of claim 54, further comprising a diode having an anode coupled to the drain node, an anode inductor, and the input node through a capacitor, and a cathode is coupled to an inductor and an output node through a second diode, and wherein the inductor is coupled to the common ground through a cathode resistor.

56. The network interface device of claim 55, wherein the transistor comprises a first transistor, the drain node comprises a first drain node, the gate node comprises a first gate node, the gate resistor comprises a first gate resistor, and further comprising a second transistor having a second drain node, and a second gate node, and wherein the second transistor is coupled to the common ground through a second gate resistor.

57. The network interface device of claim 51, wherein the disruptive reflection dampener is configured to dampen the CATV signal without mechanical switching.

58. The network interface device of claim 51, wherein the disruptive reflection dampener comprises a solid-state configuration that does not include an electromechanical switch.

59. The network interface device of claim 51, wherein the disruptive reflection dampener comprises a solid-state configuration that does not include a moving switch.

60. The network interface device of claim 51, wherein the disruptive reflection dampener is configured to dampen the CATV signal by reducing an amplitude of oscillation of the CATV signal.

* * * * *

UNITED STATES PATENT AND TRADEMARK OFFICE
CERTIFICATE OF CORRECTION

PATENT NO. : 9,832,533 B2
APPLICATION NO. : 13/969064
DATED : November 28, 2017
INVENTOR(S) : Yan Li, Paul F. Bailey and Erdogan Alkan It is certified that error appears in the above-identified patent and that said Letters Patent is hereby corrected as shown below:

In the Claims

Column 22, Line 59, "diode cathode and operably coupled to the output node." should read --diode cathode and coupled to the output node.--

Column 24, Line 58, "is in a first mode of operation, and wherein the first FET" should read --is in a first mode of operation, wherein the first FET- --

Signed and Sealed this
Twenty-third Day of October, 2018

Andrei Iancu
*Director of the United States Patent and Trademark Office*